(12) United States Patent
Helmrich et al.

(10) Patent No.: US 8,907,822 B2
(45) Date of Patent: Dec. 9, 2014

(54) SIGNAL PROCESSOR, WINDOW PROVIDER, ENCODED MEDIA SIGNAL, METHOD FOR PROCESSING A SIGNAL AND METHOD FOR PROVIDING A WINDOW

(75) Inventors: Christian Helmrich, Erlangen (DE); Ralf Geiger, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 233 days.

(21) Appl. No.: 13/610,361

(22) Filed: Sep. 11, 2012

(65) Prior Publication Data

US 2013/0241750 A1  Sep. 19, 2013

Related U.S. Application Data

(63) Continuation of application No. PCT/EP2011/053484, filed on Mar. 8, 2011.

(60) Provisional application No. 61/312,775, filed on Mar. 11, 2010.

(30) Foreign Application Priority Data

Sep. 2, 2010 (EP) .................................... 10175142

(51) Int. Cl.
| | | |
|---|---|---|
| H03M 7/30 | (2006.01) | |
| G10L 19/022 | (2013.01) | |
| G06F 17/10 | (2006.01) | |
| G10L 25/45 | (2013.01) | |
| G10L 19/02 | (2013.01) | |

(52) U.S. Cl.
CPC ............ *H03M 7/30* (2013.01); *G10L 19/0212* (2013.01); *G10L 19/022* (2013.01); *G06F 17/10* (2013.01); *G10L 25/45* (2013.01)

USPC ................................ 341/51; 341/50; 708/400

(58) Field of Classification Search
CPC ........................................................ H03M 7/30
USPC ....................................................... 341/50–51
See application file for complete search history.

(56) References Cited

U.S. PATENT DOCUMENTS

| 7,088,276 | B1 * | 8/2006 | Wegener ........................ 341/155 |
|---|---|---|---|
| 7,522,074 | B2 * | 4/2009 | Wegener ........................ 341/61 |
| 2004/0158472 | A1 | 8/2004 | Voessing |
| 2004/0250195 | A1 | 12/2004 | Toriumi |
| 2007/0185707 | A1 | 8/2007 | Gerrits et al. |

FOREIGN PATENT DOCUMENTS

| CN | 1520589 A | 8/2004 |
|---|---|---|
| CN | 1573929 A | 2/2005 |

(Continued)

OTHER PUBLICATIONS

Official Communication issued in corresponding Japanese Patent Application No. 2012-556493, mailed on Jan. 28, 2014.

(Continued)

*Primary Examiner* — Khai M Nguyen
(74) *Attorney, Agent, or Firm* — Keating & Bennett, LLP

(57) ABSTRACT

A signal processor for providing a processed version of an input signal in dependence on the input signal includes a windower configured to window a portion of the input signal, or of a pre-processed version thereof, in dependence on a signal processing window described by signal processing window values for a plurality of window value index values, in order to obtain the processed version of the input signal. The signal processor also includes a window provider for providing the signal processing window values for a plurality of window value index values in dependence on one or more window shape parameters.

6 Claims, 14 Drawing Sheets

(56) References Cited

FOREIGN PATENT DOCUMENTS

| CN | 1835078 A | 9/2006 |
|---|---|---|
| CN | 1934619 A | 3/2007 |
| EP | 1 873 753 A1 | 1/2008 |
| JP | 06-282296 A | 10/1994 |
| JP | 2004-094223 A | 3/2004 |
| JP | 2005-099405 A | 4/2005 |
| JP | 2006-243664 A | 9/2006 |
| JP | 2010-044305 A | 2/2010 |

OTHER PUBLICATIONS

Official Communication issued in corresponding Chinese Patent Application No. 201180023295.9, mailed on Aug. 30, 2013.

Official Communication issued in International Patent Application No. PCT/EP2011/053484, mailed on Apr. 20, 2011.

Nuttall, "Some Windows with Very Good Sidelobe Behavior," IEEE Transactions on Acoustics, Speech, and Signal Processing, vol. 29, No. 1, Feb. 1, 1981, pp. 84-91.

Prabhu, "A Set of Sum-Cosine Window Functions," International Journal of Electronics, vol. 58, No. 6, Jan. 1, 1985, pp. 969-974.

Nyarko et al., "A New Approach to the Estimation of Harmonics of Digitized Periodic Waveforms," IEEE WESCANEX '95 Proceedings, vol. 1, May 15, 1995, pp. 18-23.

Official Communication issued in corresponding Japanese Patent Application No. 2012-556496, mailed on Jan. 28, 2014.

Official Communication issued in corresponding Chinese Patent Application No. 201180023357.6, mailed on Sep. 4, 2013.

\* cited by examiner (SPECTRA OF SOME EXPONENTIATED SINE FUNCTIONS (12))

(SPECTRA OF OPTIMIZED SUM-OF-COSINES FUNCTIONS (15))

(THE PROPOSED OPTIMIZED
SUM-OF-SINES WINDOWS (19))

(DFT SPECTRA OF TWO SINUSOIDS WITH FREQUENCIES OF $Lf=32$ AND 96.5, AFTER APPLYING DIFFERENT WINDOW FUNCTIONS)

(SPECTRA OF TWO PC WINDOWS AND PROPOSED WINDOW)

SIGNAL PROCESSOR, WINDOW PROVIDER, ENCODED MEDIA SIGNAL, METHOD FOR PROCESSING A SIGNAL AND METHOD FOR PROVIDING A WINDOW

CROSS-REFERENCE TO RELATED APPLICATIONS

This application is a continuation of copending International Application No. PCT/EP2011/053484, filed Mar. 8, 2011, which is incorporated herein by reference in its entirety, and additionally claims priority from U.S. Application No. 61/312,775, filed Mar. 11, 2010, and European Application EP 10175142.8, filed Sep. 2, 2010, which are all incorporated herein by reference in their entirety.

BACKGROUND OF THE INVENTION

Embodiments according to the invention are related to a signal processor for providing a processed version of an input signal in dependence on the input signal, to a window provider for providing signal processing window values, to an encoded media signal, to a method for processing a signal and to a method for providing signal processing window values.

An embodiment according to the invention is related to an apparatus for encoding or decoding an audio or video signal using variable window functions. Another embodiment according to the invention is related to a method for encoding or decoding an audio or video signal using variable window functions.

Embodiments according to the present invention generally relate to signal analysis and processing methods, such as those which may be used in audio or video coding systems.

Finite impulse response (FIR) filtering of discrete signals, particularly in the context of filter banks, is widely employed in spectral analysis, processing, synthesis, and media data compression, amongst other applications. It is well understood that the temporal (or spatial) finiteness of an FIR filter, and hence the finiteness of the signal interval which can be processed at one instant in time or space, can lead to a phenomenon known as bias or leakage. When modifying the filtered interval, for example by varying gain changes or quantization, blocking or ringing artifacts can occur upon inversion of the filtering operation. It has been found that the cause of these artifacts can be ascribed to discontinuities between the endpoints of the signal waveform of the processed interval (hereafter referred to as segment), as well as those of its differentials. It has been found that in order to reduce such unwanted effects of leakage, it thus is helpful or even necessitated to minimize discontinuities in the segment and some of its differentials. This can be achieved by multiplying each sample $s(n)$, $n=0, 1, \ldots, N-1$, of the N-length segment with a certain weight $w(n)$ prior to filtering, and in the case of signal manipulation in the filtered domain, also after inverse filtering, such that the endpoints of the segment and of its differentials are tapered to zero. An equivalent approach is to apply the weights to each basis filter of the filter bank (See, for example, reference [2]). Since the weighting factors are often described by an analytical expression, a set of factors is commonly known as a weighting function or window function.

In typical audio and video coding systems, a source waveform is segmented as above, and each segment is quantized to a coarser representation to accomplish high data compression, i.e. a low bit rate necessitated for storing or transmitting the signal. In an attempt to obtain coding gain by means of energy compaction into fewer than N samples (or, in other words, to increase perceptual quality of the coded signal for a given bit rate), filter-bank transformations of the segments prior to quantization have become popular. Recently developed systems use lapped orthogonal time-to-frequency transformation in the form of the modified discrete cosine transform (MDCT), a filter bank allowing adjacent segments to overlap while still permitting critical sampling. For improved performance, the forward and inverse MDCT operations are combined with weighting of each segment: on center side, an analysis window $w_a(n)$ is applied before the forward MDCT and on receiver side, a synthesis window $w_s(n)$ is employed after the inverse MDCT. Unfortunately, not all weighting functions are suitable for use with the MDCT. Assuming predetermined (time/space invariant) windows, it has been found that in order for the entire architecture to yield perfect input reconstruction in the absence of quantization or transmission errors, $w_a(n)$ and $w_s(n)$ has to be chosen as follows:

$$w_a(n) \cdot w_s(n) + w_a(N/2+n) \cdot w_s(N/2+n) = 1, n=0,1, \ldots, N/2-1. \tag{1}$$

If $w_a(n)$ and $w_s(n)$ are to be identical, i.e. $w_a(n)=w_s(n)=w(n)$, eq. (1) reduces to the better-known constraint $$w(n)^2 + w(N/2+n)^2 = 1, n=0,1,\ldots,N/2-1, \tag{2}$$

published in reference [7]. For best energy compaction, $w(n)$ which are symmetric about $n=N/2-\frac{1}{2}$, i.e.

$$w(N-1-n)=w(n), n=0,1,\ldots,N/2-1, \tag{3}$$

are usually adopted. In the Advanced Audio Coding (AAC) standard (reference [8]), two window functions are available. One is the sine window, given by $$w_{sin}(n)=\sin(\pi \cdot (n+\frac{1}{2})/N), n=0,1,\ldots,N-1, \tag{4}$$

the other is a Kaiser-Bessel-derived (KBD) window described in the patents of Fielder and Davidson, entitled "Low bit rate transform coder, decoder, and encoder/decoder for high-quality audio," U.S. Pat. Nos. 5,109,417 and 5,142,656. The latter window is also utilized in the AC-3 (Dolby Digital) coding standard (ATSC, Inc., "Digital Audio Compression Standard (AC-3, E-AC-3), Revision B," document A/52B, June 2005), albeit in a different configuration ($\alpha=5$). The Vorbis specification (reference [9]) defines the window $$w_{vorbis}(n)=\sin(\pi/2 \cdot \sin^2(\pi \cdot (n+\frac{1}{2})/N)), n=0,1,\ldots,N-1. \tag{5}$$

FIG. 5 shows the frequency responses of the AAC and Vorbis window functions, obtained via Fourier transformation, according to reference [4]. It can be seen that the sine window has relatively high close-frequency selectivity (narrow main lobe) and relatively low stopband rejection (low side lobe attenuation). The KBD window, on the contrary, has high stopband attenuation and low close-frequency selectivity. The Vorbis window lies about midway between the former two windows.

It has been found that for some applications, it may be desirable to exert finer control over the passband selectivity and stopband rejection of a weighting function satisfying eq. (2). More specifically, it has been found that to improve coding efficiency, a window parameter may be necessitated to continuously adapt the characteristics of the window to those of the input spectrum. Of all three functions discussed above, only the KBD function offers such a parameter, $\alpha$, which can be varied to achieve different selectivity/attenuation tradeoffs. This function, however, incorporates computationally expensive mathematics (Bessel function, hyperbolic sine, square root, and division), potentially prohibiting its re-computation for every signal segment on low-power devices or in real-time systems. The same applies to the class of window functions presented in the article of Sinha and Ferreira, entitled "A New Class of Smooth Power Complementary Windows and their Application to Audio Signal Processing," AES 119th Convention, October 2005, paper 6604, necessitating complex-valued operations, spectral factorization, and Fourier transformation. It also has been found that interpolation between two functions (for example KBD and sine), most efficiently by weighted summation, can be used to somewhat control the frequency response, but this approach offers only limited flexibility.

A multitude of window functions, optimized toward different criteria, have been documented, for example, in references [1], [2], [3], [4], [5]. Arguably three of the most popular functions in use today are the ones reported by von Hann, Hamming, and Blackman.

In the following, some classic window functions will be described. In other words, in the following, the aforementioned window functions (for example, Hann, Hamming and Blackman) will be revisited and the underlying general design equation will be identified.

For the sake of consistency and comparability with seminal investigations of window functions, Nuttall's methodology and notation (see, for example, reference [4]) shall be adopted in the present discussion. In particular, let L denote the duration (length) of a window realization, t the location (time) within the weighting, and f the frequency within the window's power density spectrum, obtained by Fourier transformation of the window function. Additionally, all window functions shall be normalized to a peak amplitude of one. Since only symmetrical (advantageously even length), bell-shaped windows will be studied here, this implies $w(L/2)=1$. The first weighting function to be considered is known as the Hann (or Hanning) function. It is specified in reference [2] as $$w_{Hann}(t) = \sin^2\left(\pi \cdot \frac{t}{L}\right) \quad (11)$$

for DSP applications (nonnegative values of t). As shown in reference [2] and evident from (11), the Hann function is a special case of a class of exponentiated sine functions:

$$w_a(t) = \sin^a\left(\pi \cdot \frac{t}{L}\right), a \geq 0. \quad (12)$$

In practice, positive integers are typically assigned to a. Note that (12) can also be written as the sum of an offset and a scaled cosine:

$$w_{Hann}(t) = 0.5 - 0.5\cos\left(2\pi \cdot \frac{t}{L}\right). \quad (13)$$

This formulation allows for a particular spectral optimization of the Hann window (see the discussion below regarding evaluation and optimization) by changing the offset and the scaling factor. The outcome is the Hamming function, whose exact parameterization is given in reference [4] as $$w_{Hamming}(t) = 0.53836 - 0.46164\cos\left(2\pi \cdot \frac{t}{L}\right). \quad (14)$$

As pointed out by Nuttall (see, for example, reference [4]), the Hann and Hamming windows are two-term realizations of a class of (K+1)-term functions which shall be referred to as sum-of-cosines functions. Simplifying Nuttall's notation, they can be written as $$w_b(t) = \sum_{k=0}^{K} (-1)^k b_k \cos\left(2k\pi \cdot \frac{t}{L}\right) \quad (15)$$

for usage in DSP applications. This equals equation 11 of reference [4] with scalar 1/L omitted. Three-term implementations are also common. A simple case is (15) with K=2 and factors $$b_0=0.375, b_1=0.5, b_2=0.125, \quad (16)$$

which is equivalent to (12) with a=4. Similar to Hamming's approach, Blackman, (see for example, reference [1]) derived the following optimized $b_k$:

$$b_0=0.42, b_1=0.5, b_2=0.08. \quad (17)$$

Nuttall (see, for example, reference [4]) further refined Blackman's values for better near-field spectral response (first side lobes, see the discussion below regarding evaluation and optimization):

$$b_0=0.40897, b_1=0.5, b_2=0.09103. \quad (18)$$

The interested reader is encouraged to take a look at reference [4] for other optimized 3- and 4-term sum-of-cosines windows.

In view of the above discussion, what is needed is an alternative window function having a moderate computational complexity, but providing a good design flexibility.

SUMMARY

According to an embodiment, a signal processor for providing a processed version of an input signal in dependence on the input signal may have: a windower configured to window a portion of the input signal, or of a pre-processed version thereof, in dependence on a signal processing window described by signal processing window values for a plurality of window value index values, in order to obtain the processed version of the input signal; and a window provider for providing the signal processing window values for a plurality of window value index values in dependence on one or more window shape parameters, wherein the window provider is configured to compute a weighted sum of function values of a plurality of sine-type shaping functions, which map window value index values onto corresponding function values, to obtain the signal processing window values, wherein a weighting of the function values is determined by the window shape parameters; wherein the window provider is configured to provide the signal processing window values $w_c(t)$ for a plurality of window value index values t according to $$w_c(t) = \sum_{k=0}^{K} c'_k \sin\left((2k+1)\pi\frac{t}{L}\right),$$

wherein $K \geq 1$; and wherein $c_k'$ are window shape parameter values determined by the window shape parameters.

According to another embodiment, a signal processor for providing a processed version of an input signal in dependence on the input signal may have: a windower configured to window a portion of the input signal, or a pre-processed version thereof, in dependence on a signal processing window described by signal processing window values for a plurality of window value index values, in order to obtain the processed version of the input signal, wherein the signal processing window values are result values of a weighted summation of function values of a plurality of sine-type shaping functions which map the window value index values onto corresponding function values; wherein the signal processing window values $w_c(t)$ are defined according to $$w_c(t) = \sum_{k=0}^{K} c'_k \sin\left((2k+1)\pi \frac{t}{L}\right),$$

wherein t takes values between 0 and L/2 for a window slope, and wherein K≥1.

According to another embodiment, a method for providing a processed version of an input signal in dependence on the input signal may have the steps of: windowing a portion of the input signal, or of a pre-processed version thereof, in dependence on a signal processing window described by signal processing window values for a plurality of window value index values, in order to obtain the processed version of the input signal; and providing the signal processing window values for a plurality of window value index values in dependence on one or more window shape parameters, wherein a weighted sum of function values of a plurality of sine-type shaping functions is computed to obtain the signal processing window values, wherein the sine-type shaping functions map window value index values onto corresponding function values, and wherein a weighting of the function values is determined by the window shape parameters; wherein the signal processing window values $w_c(t)$ for a plurality of window value index values t are provided according to $$w_c(t) = \sum_{k=0}^{K} c'_k \sin\left((2k+1)\pi \frac{t}{L}\right),$$

wherein K≥1; and wherein $c_k'$ are window shape parameter values determined by the window shape parameters.

According to another embodiment, a method for providing a processed version of an input signal in dependence on the input signal may have the steps of: windowing a portion of the input signal, or of a pre-processed version thereof, in dependence on a signal processing window described by signal processing window values for a plurality of window value index values, in order to obtain the processed version of the input signal, wherein the signal processing window values are result values of a weighted summation of function values of a plurality of sine-type shaping functions, which map window value index values onto corresponding function values; wherein the signal processing window values $w_c(t)$ are defined according to $$w_c(t) = \sum_{k=0}^{K} c'_k \sin\left((2k+1)\pi \frac{t}{L}\right),$$

wherein t takes values between 0 and L/2 for a window slope, and wherein K≥1.

Another embodiment may have a computer program for performing the inventive methods when the computer program runs on a computer.

An embodiment according to the invention creates a signal processor for providing a processed version of an input signal in dependence on the input signal. The signal processor comprises a windower configured to window a portion of the input signal, or of a pre-processed version thereof, in dependence on a signal processing window described by signal processing window values for a plurality of window value index values, in order to obtain the processed version of the input signal. The signal processor also comprises a window provider for providing the signal processing window values for a plurality of window value index values in dependence on one or more window-shape parameters. The window provider is configured to evaluate a sine function for a plurality of argument values associated with the window value index values, to obtain the signal processing window values. The window provider is configured to compute a weighted sum of a linear term, which is linearly dependent on the window value index values, and function value of one or more shaping functions, which one or more shaping functions map window value index values onto corresponding function values, and which one or more shaping functions are point-symmetric with respect to a center of a window slope, to obtain the argument values.

This embodiment according to the invention is based on the finding that a windowing of an input signal can be achieved in an easily adjustable manner by determining the signal processing window values in the above-described manner because a weighted summation of a linear term and one or more shaping functions can be performed with very low computational effort. Nevertheless, there has also been found that the point symmetry of the one or more shaping functions and the evaluation of a sine function for a plurality of argument values bring along particularly good properties of the window like, for example, good energy-conservation characteristics between two subsequent window slopes. In addition, it is easily possible to adjust the characteristics of the window defined by the signal processing window values by modifying the weighting of the one or more shaping functions in dependence on the one or more window shape parameters, such that windows of different characteristics are obtainable with comparatively small computational effort. For example, the concept defined herein allows to obtain a large number of different window shapes, all having the mentioned good characteristics, by varying the weighting of the one or more shaping functions.

Moreover, it should be noted that using the above mentioned concept, a computation of windows having different characteristics, which can be adjusted with very high granularity, does not necessitate particularly difficult computations, but merely necessitates the formation of a weighted sum, to obtain argument values, and the evaluation of a sine function using the argument values.

Another embodiment according to the invention creates a signal processor for providing a processed version of an input signal in dependence on the input signal. The signal processor comprises a windower configured to window a portion of the input signal, or of a pre-processed version thereof, in dependence on a signal processing window described by signal processing window values for a plurality of window value index values, in order to obtain the processed version of the input signal. The signal processing window values are result values of a sine function evaluation for a plurality of argument values associated with window value index values, wherein the argument values are weighted sums of a linear term, which is linearly dependent on the window value index values, and function values of one or more sine-type shaping functions, which one or more sine-type shaping functions map window value index values onto corresponding function values and which one or more sine-type shaping functions are point-symmetric with respect to a center of a window slope. This embodiment according to the invention is based on the same key ideas as the previously-discussed embodiment. Also, it has been found that the use of sine-type shaping functions brings along signal processing windows having particularly good characteristics.

Another embodiment according to the invention creates a window provider for providing signal processing window values for a plurality of window value index values in dependence on one or more window shape parameters. The window provider is configured to evaluate a sine function for a plurality of argument values associated with the window value index values, to obtain the signal-processing window values. The window provider is configured to compute a weighted sum of a linear term, which is linearly dependent on the window value index values, and function values of one or more shaping functions, to obtain the argument values. The one or more shaping functions map window value index values onto corresponding function values, and the one or more shaping functions are point-symmetric with respect to a center of a window slope.

This embodiment according to the invention is based on the same ideas as the above embodiments.

Another embodiment according to the invention creates a signal processor for providing a processed version of an input signal in dependence on the input signal. The signal processor comprises a windower configured to window a portion of the input signal, or of a pre-processed version thereof, in dependence on a signal processing window described by signal processing window values for a plurality of window value index values, in order to obtain the processed version of the input signal. The signal processor also comprises a window provider for providing the signal processing window values for a plurality of window value index values in dependence on one or more window shape parameters. The window provider is configured to compute a weighted sum of function values of a plurality of sine-type shaping functions, which map window function value index values onto corresponding function values, to obtain the signal processing window values. The weighting of the function values is determined by the window shape parameters. This embodiment according to the invention is based on the finding that window shapes having sufficiently good characteristics for many applications can be obtained, with good computational efficiency and the flexibility to adjust the window characteristics, using the window-shape parameters and the described computation rule.

Another embodiment according to the invention creates a signal processor for providing a processed version of an input signal in dependence on the input signal. The signal processor comprises a windower configured to window a portion of the input signal, or a pre-processed version thereof, in dependence on a signal processing window described by signal processing window values for a plurality of window value index values, in order to obtain the processed version of the input signal. The signal processing window values are result values of a weighted summation of function values of a plurality of sine-type shaping functions which map window value index values onto corresponding function values. This embodiment according to the invention is based on the same ideas as the previously-discussed embodiment.

Another embodiment according to the invention creates an encoded media signal. The encoded media signal comprises an encoded representation of a media content and one or more window shape parameters. The one or more window shape parameters define a shape of a window to be applied in a decoding of the encoded representation of the media content. The one or more window shape parameters describe weights for computing a weighted sum of a linear term, which is linearly dependent on a window value index value and function values of one or more shaping functions, to obtain an argument value for deriving signal processing window values for a plurality of window value index values by evaluating a sine function for a plurality of argument values. This enclosed media signal provides a high flexibility for the signaling of the windowing, because it is possible to describe a large number of different types of windows, which can be derived efficiently by a decoder, using the window shape parameters.

BRIEF DESCRIPTION OF THE DRAWINGS

Embodiments of the present invention will be detailed subsequently referring to the appended drawings, in which.

DETAILED DESCRIPTION OF THE INVENTION

Figure 1A:
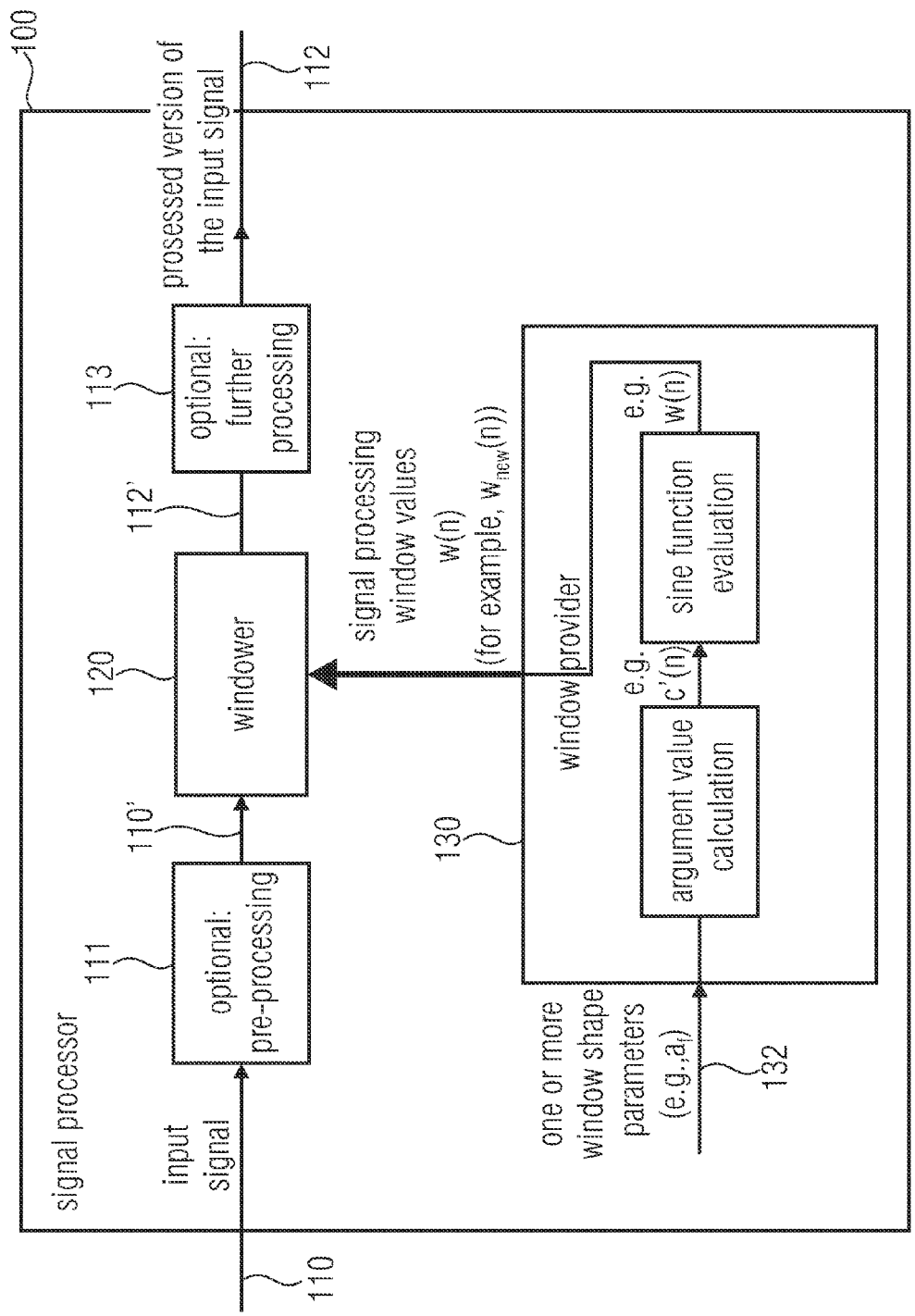
FIG. 1a shows a block schematic diagram of a signal processor, according to an embodiment of the invention.

1. Signal Processor According to FIG. 1a

FIG. 1 shows a block schematic diagram of a signal processor 100 according to a first embodiment of the invention.

The signal processor 100 is configured to receive an input signal 110 and to provide, on the basis thereof, a processed version 112 of the input signal. The signal processor 100 comprises a windower 120 configured to window a portion of the input signal 110, or a pre-processed version 110' thereof (which may be obtained by an optional pre-processing 111), in dependence on a signal processing window described by signal processing window values 122 for a plurality of window value index values n, in order to obtain the processed version 112 of the input signal (or a version 112' of the input signal which experiences further post-processing in an optional post-processor 130).

For this purpose, the windower 120 receives the signal processing window values w(n) from a window provider 130, which is typically also part of the signal processor 100. The window provider 130 is configured to provide the signal processing window values w(n) for a plurality of window value index values n in dependence on one or more window shape parameters 132. The window provider is configured to evaluate a sine function for a plurality of argument values c'(n) associated with the window value index values n, to obtain the signal processing window values w(n). The window provider 130 is also configured to compute a weighted sum of a linear term, for example, designated with c(n), which is linearly dependent on the window value index value n, and function values of one or more shaping functions. The one or more shaping functions map window value index values n onto corresponding function values. The one or more shaping functions are point-symmetric with respect to a center of a window slope. A computation of the weighted sum is performed to obtain the argument values c'(n).

Accordingly, the window provider 130 provides signal processing window values w(n) which describe windows having particularly good characteristics. The application of a sine function evaluation in the window provider, in order to obtain the signal processing window value w(n), allows to obtain windows which have good energy conservation characteristics for the case that two corresponding window slopes are overlapped. Moreover, by using argument values c'(n) for the sine function evaluation which are not a linear function of the window value index values (also briefly designated as "index values"), but rather a superposition of a linear term, which is linearly dependent on the index values and function values of one or more shaping functions which are non-linear and point-symmetric with respect to a center of a window slope, it is possible to adjust a shape of the signal processing window described by the signal processing window values w(n).

For example, it is possible to adjust the contributions of the one or more shaping functions onto the argument values c'(n), such that different evolutions of the argument values (as a function of the index value n) can be obtained in dependence on the one or more window shape parameters 132. Accordingly, the characteristics of the signal processing window described by the signal processing window values can be adjusted to the particular needs in dependence on the one or more window shape parameters 132. Moreover, it has been found that the choice of one or more shaping functions, which are point-symmetric with respect to a center of a window slope, helps to ensure good energy conservation and compaction characteristics of the signal processing window and also provides a chance to reduce a computational effort for calculating the argument values.

Details regarding the computation of the signal processing window values $w_{new}(n)$, which may take the place of the signal processing window values w(n), will be described below.

2. Signal Processor According to FIG. 1b

Figure 1B:
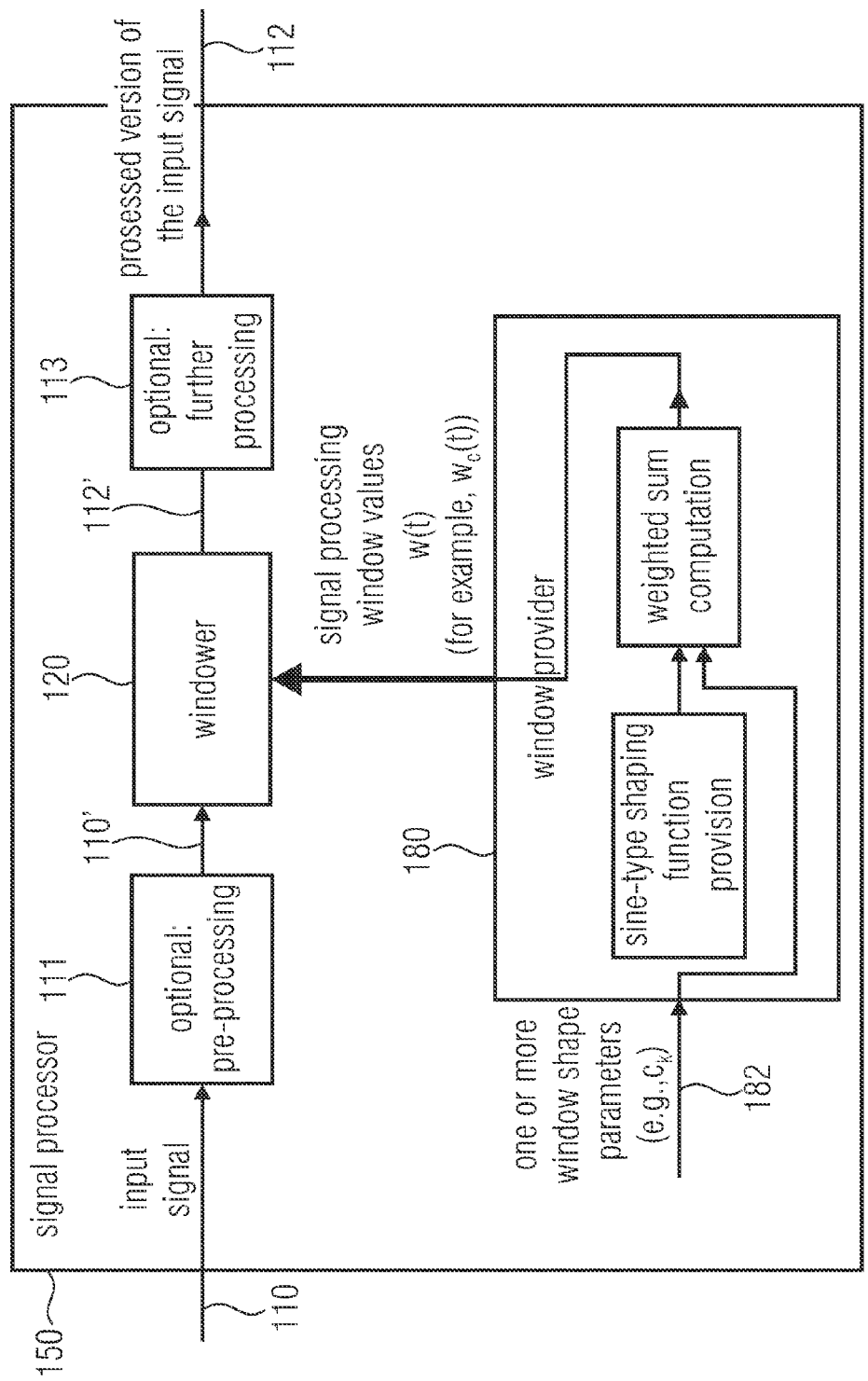
FIG. 1b shows a block schematic diagram of a signal processor, according to another embodiment of the invention.

FIG. 1b shows a block schematic diagram of a signal processor 150, which is similar to the signal processor 100. Accordingly, identical means and signals are designated with identical reference numerals. However, the signal processor 150 comprises a window provider 180, which is different from the window provider 130. Window provider 180 receives one or more shape parameters $c_k$, 182 and provides, on the basis thereof, signal processing window values w(t), which are designated, for example, with $w_c(t)$. It should be noted here that the variable t is a window value index value, and is also briefly designated as "index value".

The window provider 180 is configured for providing the signal processing window values w(t) for a plurality of window value index values t in dependence on one or more window shape parameters $c_k$. The window provider 180 is configured to compute a weighted sum of function values of a plurality of sine-type shaping functions, which map window value index values onto corresponding function values, to obtain the signal processing window values w(t). The weighting of the function values is determined by the window shape parameters $c_k$.

By providing the signal processing window values using the window provider 180, the signal processing window values can be provided such that they comprise sufficiently good characteristics in many cases. Also, it is possible to adjust the specific characteristics using the one or more window shape parameters $c_k$, such that different signal processing windows are obtainable for a different choice of one or more of the window shape parameters.

By using sine-type shaping functions and forming a weighted sum of the function values of said sine-type weighting functions, windows having good characteristics are obtained, as will be discussed in detail below.

Moreover, it should be noted that details regarding the computation of the signal processing window values w(t), which are provided by the window provider 180, will be discussed below.

3. Signal Processor According to FIG. 2

Figure 2:
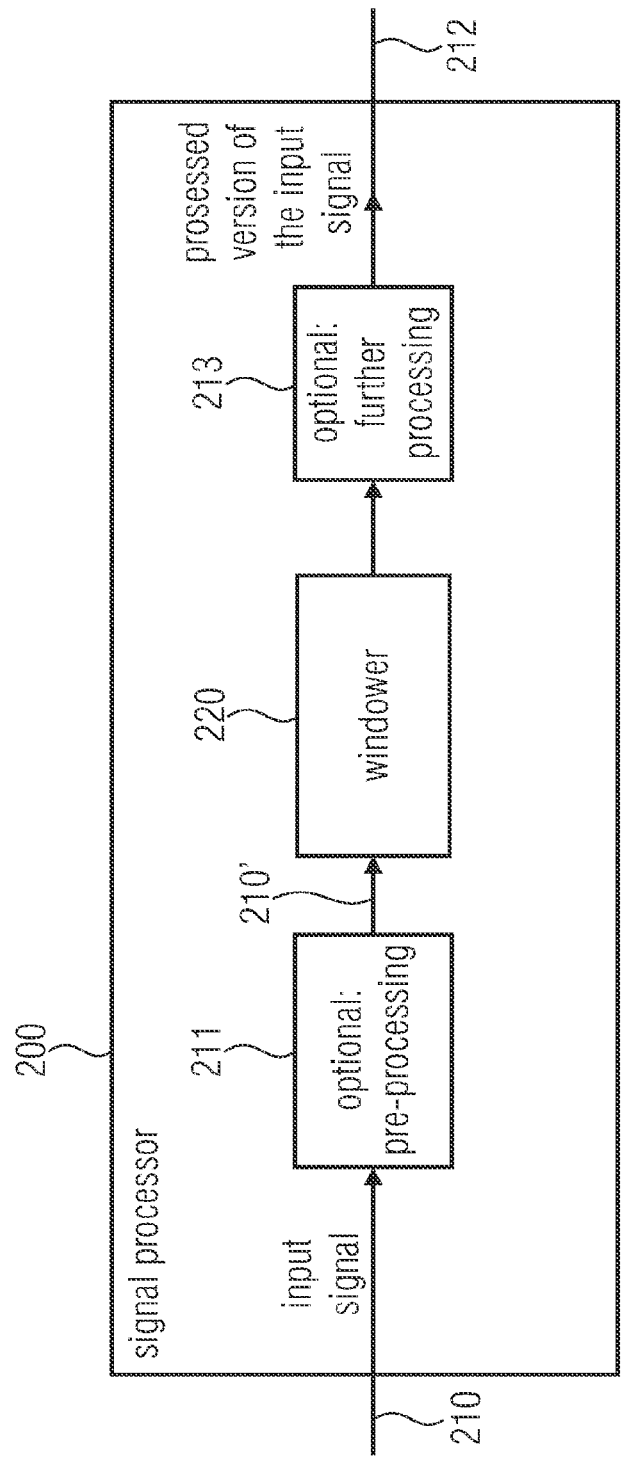
FIG. 2 shows a block schematic diagram of a signal processor, according to another embodiment of the invention.

FIG. 2 shows a block schematic diagram of a signal processor 200, according to an embodiment of the invention. The signal processor 200 is configured to receive an input signal 210 and to provide, on the basis thereof, a processed version 212 of the input signal.

The signal processor 200 comprises a windower 220 configured to window a portion of the input signal 210, or of a pre-processed version 210 thereof, in dependence on a signal processing window described by signal processing window values for a plurality of window value index values (briefly designated as "index values"), in order to obtain the processed version 212 of the input signal. The signal processor 200 may comprise an optional pre-processing 211 and an optional post-processing 213.

The signal processing window values are result values of a sine function evaluation for a plurality of argument values associated with window value index values, wherein the argument values are weighted sums of a linear term, which is linearly dependent on the window values index values, and function values of one or more sine-type shaping functions, which one or more sine-type shaping functions map window value index values onto corresponding function values. The one or more sine-type shaping functions are point-symmetric with respect to a center of a window slope.

The windower 220 may consequently perform a windowing, which is very similar to the windowing performed by the windower 120. For example, the signal processing window values used by the windower 220 may be identical to the signal processing window values used by the windower 120. The signal processing window values used by the windower 220 may, for example, be stored in a look-up table or may be obtained otherwise.

In alternative embodiments, different signal processing window values may be used. In an alternative embodiment, the signal processing window values are result values of a weighted summation of function values of a plurality of sine-type shaping functions, which map window value index values onto corresponding function values.

To conclude, the windower 220 may, for example, be configured to apply a window described by signal processing window values $w_{new}(n)$ to the input signal 210, or to the pre-processed version 211' thereof. Alternatively, however, the windower 220 may apply the signal processing window values $w_c(t)$ to the input signal 210 or to the pre-processed version 210' thereof.

Details regarding the signal processing windows applied by the windower 220 could be described below.

4. Window Provider According to FIG. 3

Figure 3:
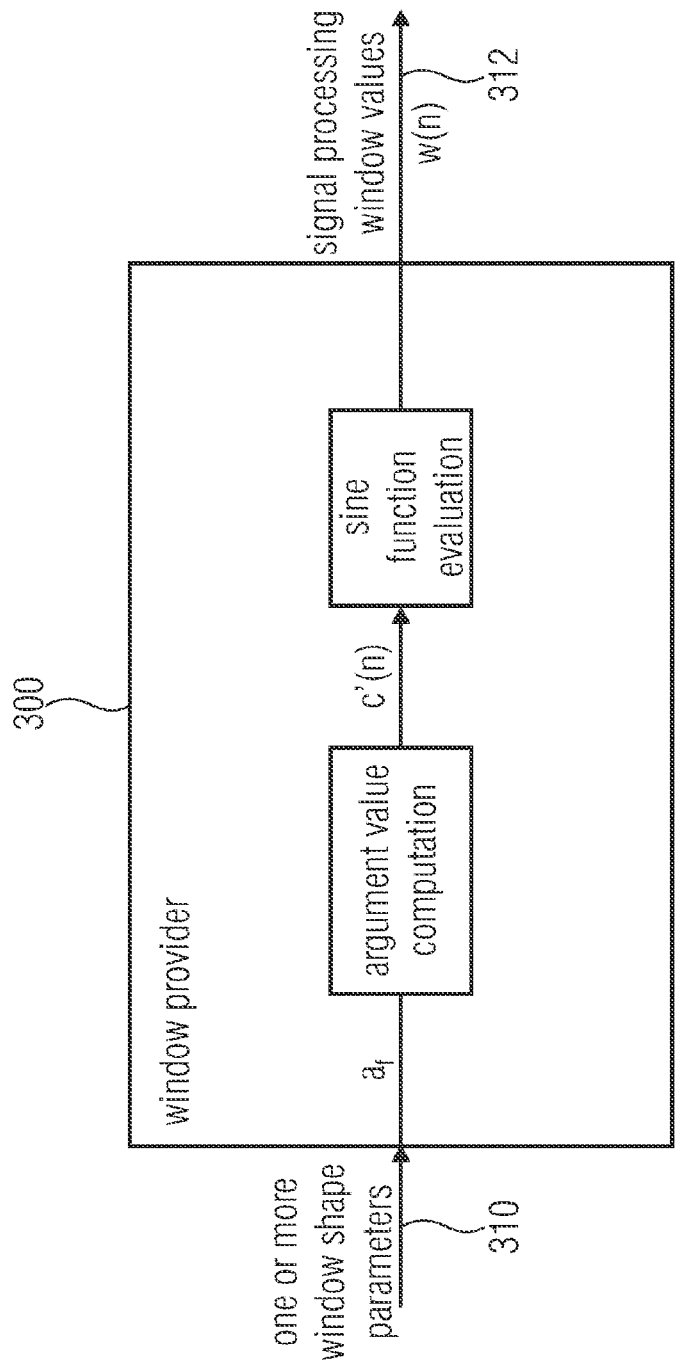
FIG. 3 shows a block schematic diagram of a window provider, according to an embodiment of the invention.

FIG. 3 shows a block schematic diagram of a window provider 300 according to an embodiment of the invention. The window provider 300 is configured to receive one or more window shape parameters 310, which are typically variable values, and to provide, on the basis thereof, a set of signal processing window values w(n) 312 for a plurality of window value index values. The window provider 300 is configured to evaluate a sine function for a plurality of argument values associated with the window value index values, to obtain the signal processing window values w(n). The window provider is also configured to compute a weighted sum of a linear term, sometimes designated with c(n), which is linearly dependent on the window value index values n and function values of one or more shaping functions. The one or more shaping functions map window value index values n onto corresponding function values. The one or more shaping functions are point-symmetrical with respect to a center of a window slope.

Accordingly, the window provider 300 essentially fulfills the functionality of the window provider 130. However, it should be noted that the window provider 300 may be a component which is independent from the windower 130. Alternatingly, however, the window provider 300 may fulfill the functionality of the window provider 180.

5. Encoded Media Signal According to FIG. 4

Figure 4:
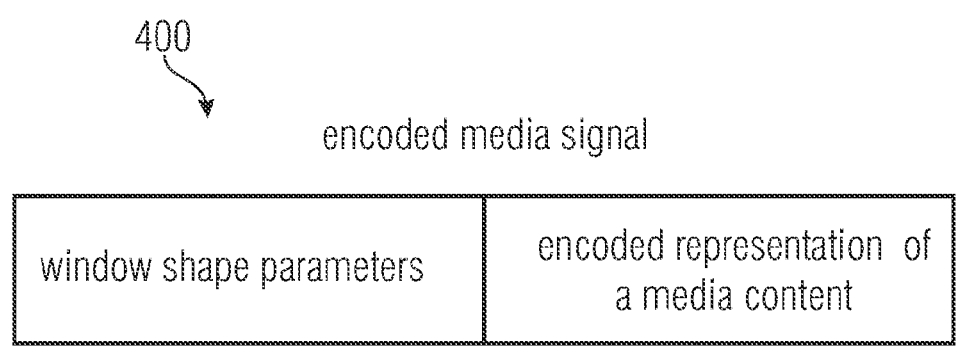
FIG. 4 shows a schematic representation of an encoded media signal, according to an embodiment of the invention.

In the following, an encoded media signal will be described. A schematic representation of such an encoded media signal is shown in FIG. 4. The encoded media signal 400 comprises an encoded representation of a media content and window shape parameters. The window shaped parameters are, for example, adapted to serve as the one or more window shape parameters 132 for the window provider 130 or to serve as the one or more window shape parameters 132 for the window provider 180. Accordingly, the window shape parameters in the encoded media signal 400 are chosen to produce signal processing window values w(n) or w(t) using the window provider 130 or the window provider 180. Also, the encoded representation of the media content is typically encoded using a windowing in accordance with a window described by the window shape parameters.

6. Details Regarding the Windows Provided by the Window Provider 130 or Used by the Windower 220

6.1 Overview and Definitions

In the following, some details regarding the windows provided by the window provider 130 will be described, which windows may also be used by the windower 220. It should be noted here that the windows are defined here by signal processing window values w(n). Said signal processing window values w(n) are typically multiplied with the input signal 110, or the pre-processed version 110' thereof, to obtain a windowed version of the input signal, or of the pre-processed version 110' thereof. A window is typically described by the signal processing window values w(n), wherein n is an index value (for example, a time index value) designating the signal processor window values.

In addition, it should be noted that a window typically comprises a left-sided window slope and a right-sided window slope. A window may further, optionally, comprise a constant (or approximately constant) central portion, such that a number of central signal processing window values take a common predetermined value. However, it should be noted that a left-sided window slope and a right-sided window slope of a window may be different. Accordingly, it should be pointed out that the following discussion substantially describes a shape of a single window slope, i.e. of a transition between a small window value (for example, a zero window value) and a large window value (for example, a maximum window value of one).

Figure 16:
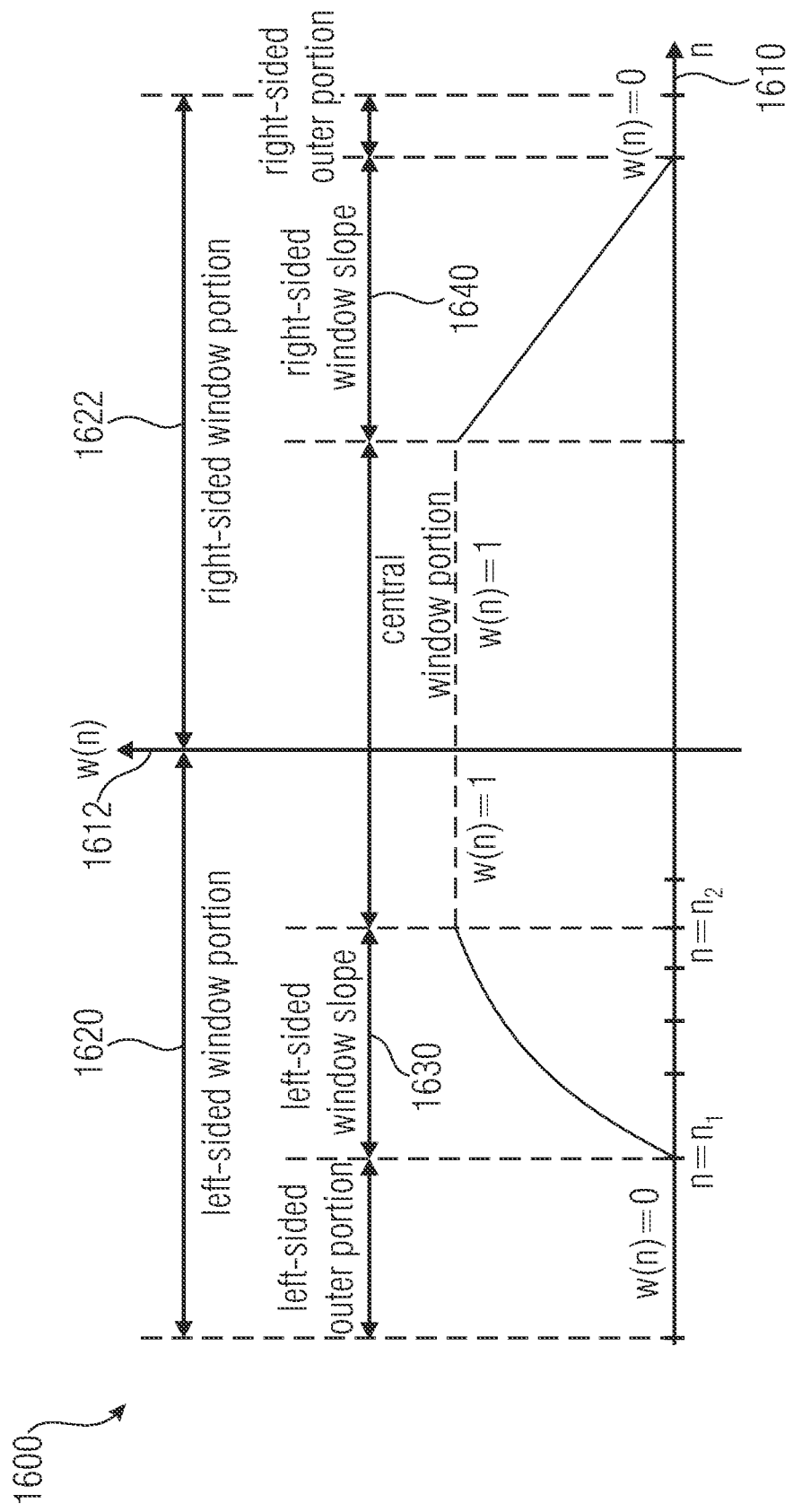
FIG. 16 shows a schematic representation of a window.

Taking reference now to FIG. 16, which shows a schematic representation of a window, this will be explained in more detail in the graphical representation of FIG. 16, an abscissa 1610 describes the index value n, and an ordinate 1612 describes signal processing window values w(n) associated with the index values n. As can be seen, the window 1600 comprises a left-sided window portion 1620 and a right-sided window portion 1622. The left-sided window portion comprises, as a key element, a left-sided window slope 1630. The left-sided window slope 1630 is defined, for example, by a plurality of signal processing window values w(n) for $n=n_1$ to $n=n_2$. The left-sided window portion 1620 may, optionally, also comprise a left-sided outer portion, for which the signal processing window values w(n) take a small value of, for example, w(n)=0. The left-sided window portion optionally also comprises a part of a central window portion, for which the signal processing window values w(n) take a predetermined value of, for example, w(n)=1. The window 1600 comprises a right-sided window portion 1622, which comprises, as a key element, a right-sided window slope 1640. The right-sided window portion may optionally comprise a part of a central window portion, for which the signal processing window values take a predetermined value of, for example, w(n)=1. The right-sided window portion may also, optionally, comprise a right-sided outer portion, for which the signal processing window values w(n) take a small value of, for example, w(n)=0.

It should be noted that the left-sided outer portion, the central window portion and the right-sided outer window portion should be considered as being optional. Also, it should be noted that the window 1600 may be symmetric or asymmetric. Thus, the left-sided window slope 1630 and the right-sided window slope 1640 may be equal, or may be significantly different in some embodiments.

It should be noted here that the following discussion substantially relates to the left-sided window slope 1630, i.e. to a transition between small or zero window values and a large or maximum window value. However, it should be noted that an overall window 1600 can be obtained from the knowledge of the left-sided window slope 1630 by optionally adding a left-sided outer portion and by optionally adding a central window portion and by adding a right-sided window slope and by optionally adding a right-sided outer portion. It should also be noted that the right-sided window slope 1640 may be obtained in the same way as a left-sided window slope using a simple mirroring process such as that of equation (3).

It should also be noted here that in accordance with the following discussion, the left-sided window slope should be described by values w(n) for n=0 to n=N/2−1. However, a usage of different index values is naturally possible.

6.2 Details of the Window $w_{new}(n)$

Embodiments according to the invention address the lack of flexible and computationally efficient window functions for MDCT applications by declaring an extension to the sine window functions of equation (4).

Note that equation (4) can be considered as the sine of a triangular window function symmetric about n=N/2−½. Given equation (3), this implies $$c(n) = (n + \tfrac{1}{2}) \cdot 2/N, \quad (6)$$

$$w_{sin}(n) = \sin(\pi/2 \cdot c(n)), n=0,1,\ldots,N/2-1, \quad (7)$$

where c(n) denotes the window core function, which can be computed in advance since it is predetermined. The proposed extension is to add to c(n) in equation (7) weighted sinusoids having angular frequencies which are integer multiples of $2\pi$:

$$c'(n) = c(n) + \Sigma a_f \sin(2\pi \cdot f \cdot c(n)), f=1,2,\ldots, \quad (8)$$

$$w_{new}(n) = \sin(\pi/2 \cdot c'(n)), n=0,1,\ldots,N/2-1. \quad (9)$$

The sine terms in c'(n) can also be calculated in advance. Only their weighting, as specified by the of factors, needs to be adapted. Hence, when adjusting the proposed window to a signal on a transform-by-transform basis, only equation (9) and the weighting in equation (8) have to be re-computed, making the adaptation computationally less complex than that of the KBD and Sinha-Ferreira windows.

Furthermore it is worth mentioning that, due to the sine terms in equations (8) and (9), each realization of the proposed class of window functions fully decays to zero at its endpoints, which ensures a side lobe level decay of at least 12 dB per octave in the window's frequency response. This is not the case with the KBD window and the windows published in the article of Princen and Bradley, "Analysis/Synthesis Filter Bank Design Based on Time Domain Aliasing Cancellation," IEEE Trans. Acoustics, Speech, and Signal Processing, October 1986, pp. 1153-1161 and in the article of Ferreira, "Convolutional Effects in Transform Coding with TDAC: An Optimal Window," IEEE Trans. Speech and Audio Processing, March 1996, pp. 104-114, whose far-frequency side lobes therefore decay at less than 12 dB per octave. For equal main lobe widths, this means that a window according to equations (8) and (9) potentially outperforms the prior-art windows in terms of far-frequency side lobe attenuation.

The computation or adaptation of a window according to the present invention comprises the following steps:
Selecting the number of sine terms in c'(n) and appropriate weighting factors af based on design considerations.
Determining or defining the window length N and computing c'(n) with the selected $a_f$ and number of sine terms.
Computing $w_{new}(n)$ of equation (9) for n=0, 1, ..., N/2−1, then employing equation (3) to obtain a length-N window instance.
If a different window parametrization is used for the preceding adjacent segment, satisfying any perfect inversion constraints either by correcting the right half of the preceding window instance, or by correcting the left half of the current window instance, or by correcting both the right half of the preceding and left half of the current instance.

In an embodiment, the window function is comparable to the sine and Vorbis windows with regard to computational complexity but provides at least the design flexibility of the KBD and Sinha-Ferreira windows.

With respect to the above, it should be noted that the values c'(n) can be considered as argument values associated with the window value index values n. Also, it should be noted that the functions $\sin(2\pi f \cdot c(n))$ may be considered as shaping functions.

Also, it should be noted that it is not necessitated to use sine functions as the shaping functions. Rather, it may be sufficient to choose the shaping functions such that the shaping functions are point-symmetric with respect to a center of a window slope. The center of the window slope is defined, for example, by a value of the linear term c(n)=0.5. For example, point-symmetric polynomial functions may be used instead of sine functions, which may facilitate the evaluation in some cases. Also, the shaping functions should take a value which is sufficiently close to zero for c(n)=0 and c(n)=1, i.e. in an environment of a leftmost window value index value of the window slope and in an environment of the rightmost window value index value of the window slope. In other words, the shaping functions should have zeros, or should take approximately zero values, in the environments (or neighborhoods) of the leftmost window value index value (e.g. n=0) and the rightmost window value index value (e.g. n=N/2−1).

Moreover, it should be noted that equations (6) and (7) may be evaluated, for example, by the argument value calculation of the window provider 130, and that the equation (9) may be evaluated by the sine function evaluation of the window provider 130. Accordingly, the values $w_{new}(n)$ obtained by the sine function evaluation of the window provider 130 for n=0 to n=N/2−1 may describe, for example, a left-sided window slope 1630.

The window provider 130 may consequently be configured to assemble an entire window 1610 on the basis of said signal processing window values associated with a left-sided window slope. For this purpose, the window provider may add a left-sided outer portion, a central window portion, a right-sided window slope and a right-sided outer portion, as shown in FIG. 16. The right-sided window slope may be obtained by a mirroring of the left-sided window slope for the case of a symmetric window. Alternatively, however, the right-sided window slope may be different from the left-sided window slope, and may be obtained by a mirroring of a window slope obtained for different window shape parameters than the left-sided window slope.

Also, it should be noted that it may be ensured by the signal processor that a right-sided transition slope associated with a preceding portion of the input signal and a left-sided transition slope associated with a subsequent portion of the input signal are matched in that the perfect inversion constraints are satisfied. For this purpose, it may be ensured that the left-sided window slope associated with the subsequent portion of the input signal is obtained using the same parameters which have been applied for obtaining the right-sided window slope associated with the preceding portion of the input signal.

Moreover, it should be noted that the algorithm defined by equations (6), (8) and (9) is well-suited for an online computation of window functions in an apparatus having limited computational power.

Nevertheless, the windows as defined by equations (6), (8) and (9) may be evaluated once, and the results thereof may be stored in a lookup table for later use in some embodiments.

6.3. Comments on the Window Design

In the following, some conditions will be discussed which result in windows having particularly good characteristics. Nevertheless, it should be noted that the obeyance of the conditions discussed in the following should not be considered as being essential.

As mentioned in the discussion of the Background section, signal coders employing the MDCT need to impose certain conditions on the window function applied to the signal in order to allow the entire system to be fully invertible, i.e. offer perfect input reconstruction, when no signal manipulations are carried out. Functions conforming to equation (2), also known as power complementary functions, represent a suitable category. All realizations of the present window class belong to this category. However, it can be shown that realizations with nonnegative c'(n) for all deployed n, $$c'(n) \geq 0, n=0,1,\ldots,N/2-1, \quad (10)$$

yield particularly good passband selectivity and stopband rejection simultaneously. The following discussion will therefore focus on this subset of the window class. In some cases, only realizations with nonnegative c'(n) for all deployed n yield satisfactory passband selectivity and stopband rejection simultaneously.

While in general, it is possible to use an arbitrary number of sine terms in equation (8) to design window frequency responses tailored to the given use case, it was discovered that two sine terms (f=1, 2) provide an adequate tradeoff between flexibility, complexity, and memory use. In particular, using two sine terms, parameters can be derived which
- minimize the main lobe width, i.e. maximize the close-frequency selectivity,
- minimize the maximum side lobe level above a certain normalized frequency,
- maximize the rate of side lobe decay, i.e. the far-frequency stopband attenuation,
- minimize the maximum difference to an existing reference window instance of a window instance. Each of these design considerations will be examined below with the help of specific examples.

6.3.1 Windows with Maximum Passband Selectivity

Figure 5:
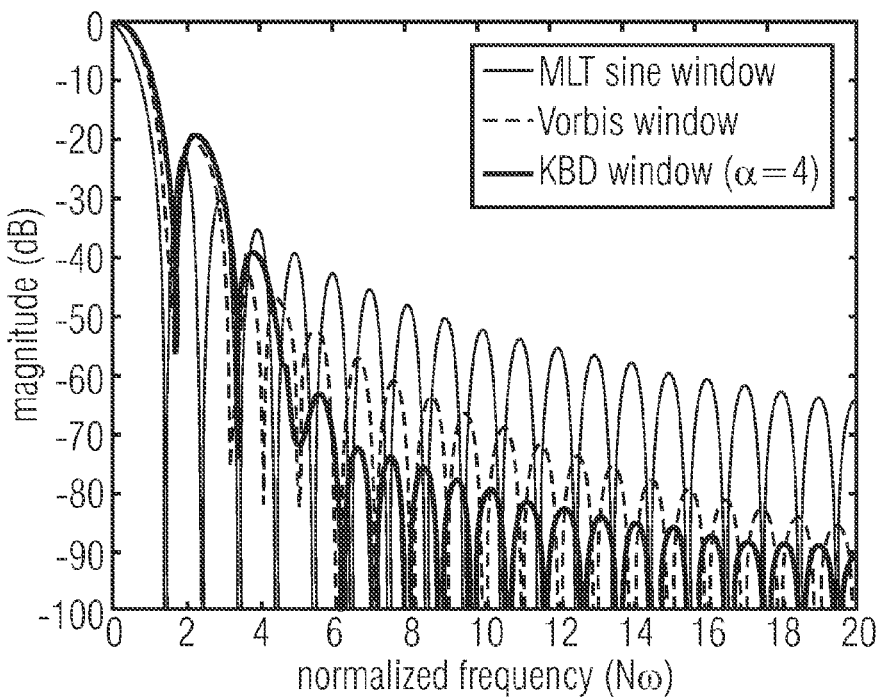
FIG. 5 shows a graphical representation of frequency magnitude responses of the AAC and Vorbis windows on a dB ordinate scale.

Although the power complementarity condition of equation (2) limits the range of achievable frequency responses, especially regarding the width and level of the first few side lobes, the window function leading to the narrowest main lobe can be obtained by setting all $a_f$ factors in c'(n) to zero. The resulting window, as is readily apparent, equals the AAC sine window of equation (4). Its spectrum is depicted in FIG. 5 along with those of the KBD ($\alpha$=4) and Vorbis windows.

In short, however, it should be noted that at least one of the window shape parameters $a_f$ should be set to a non-zero value. Nevertheless, the above-described structure of the window provider 113 gives the flexibility to obtain even the AAC sine window without any specific signal by merely setting the window shape parameters $a_f$.

6.3.2 Windows with Minimum Side Lobe Maximum

Figure 6:
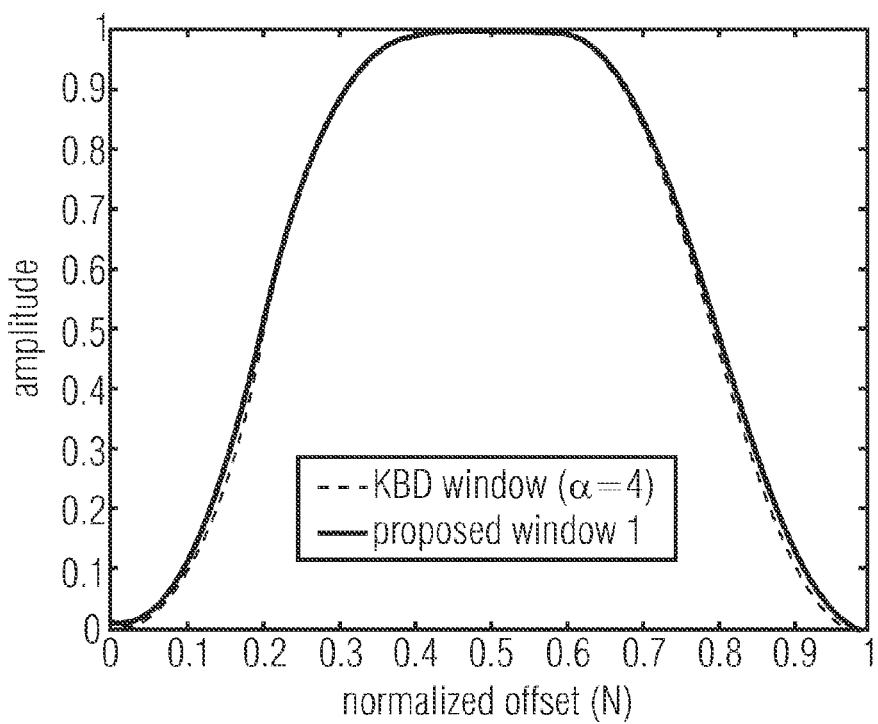
FIG. 6 shows a graphical representation of the amplitudes of the AAC KBD window function and a certain instance of the inventive function.
Figure 7:
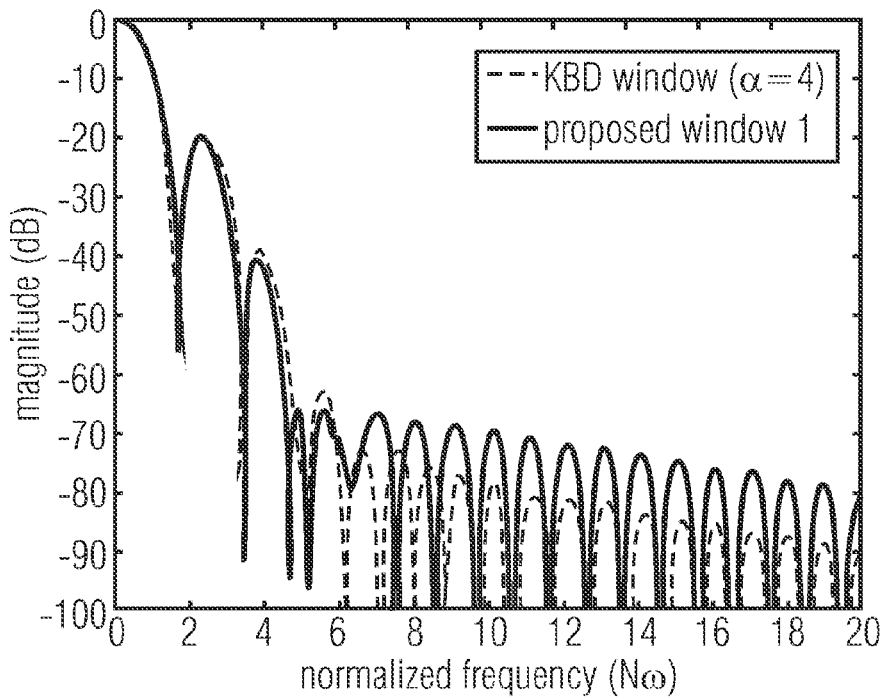
FIG. 7 shows a graphical representation of the frequency magnitude response of said instance of the inventive window function compared to that of the AAC KBD window on a linear abscissa and dB ordinate scale.

Configurations of equation (9) which minimize the maximum side lobe level can be acquired by jointly optimizing the $a_f$ parameters, either via exhaustive or gradient-based search methods. However, owing to equation (2), it is recommendable to define a lower frequency border $N\omega_0>1.5$ above which the minimax optimization is to be performed. It was found that a value of $N\omega_0=4.5$ produces the parameters $a_1=0.1224$ and $a_2=0.00523$. The so-configured window function is shown in FIG. 6. The similarity to the AAC KBD window function, which is also depicted, is evident. The corresponding window spectra are shown in FIG. 7. It is worth noting the lower level of the first two side lobes of the inventive window when compared to the KBD window, as well as the reduction in maximum side lobe level above $N\omega_0\approx5$ (the first three side lobes of the proposed window above this frequency have a level of −66.8 dB, whereas the KBD window reaches a somewhat higher level of −63.0 dB).

Figure 8:
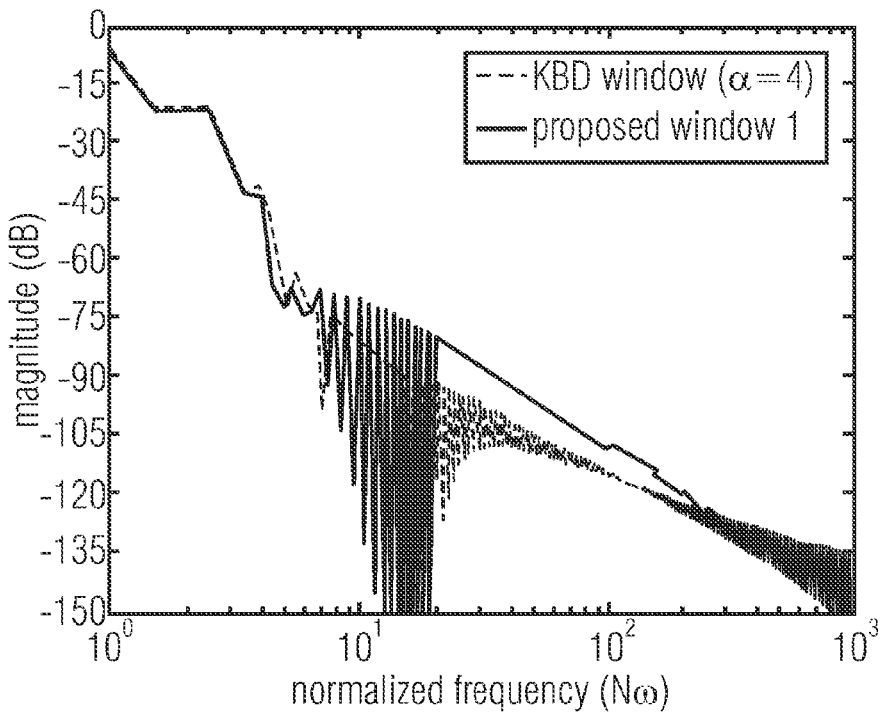
FIG. 8 shows a graphical representation of the frequency magnitude response of said instance of the inventive window function compared to that of the AAC KBD window on a logarithmic abscissa and dB ordinate scale.

Due to the use of sine terms in c'(n), every realization of the present window class is continuous and, hence, guaranteed to smoothly decay to zero at its endpoints. This advantage is illustrated in FIG. 8. As can be seen, the side lobes of the previously derived window fall off at a rate of 12 dB per octave. The KBD window, in contrast, exhibits a lesser fall-off rate, the reason being slight discontinuities at the endpoints of the KBD's weighting function. As a result, the proposed window achieves higher rejection than the KBD window above $N\omega\approx250$ even though it is outperformed by the latter between $N\omega\approx250$ and $N\omega\approx7$. In some analysis or synthesis applications, this feature can be of benefit.

6.3.3 Windows with Maximum Side Lobe Decay

Figure 9:
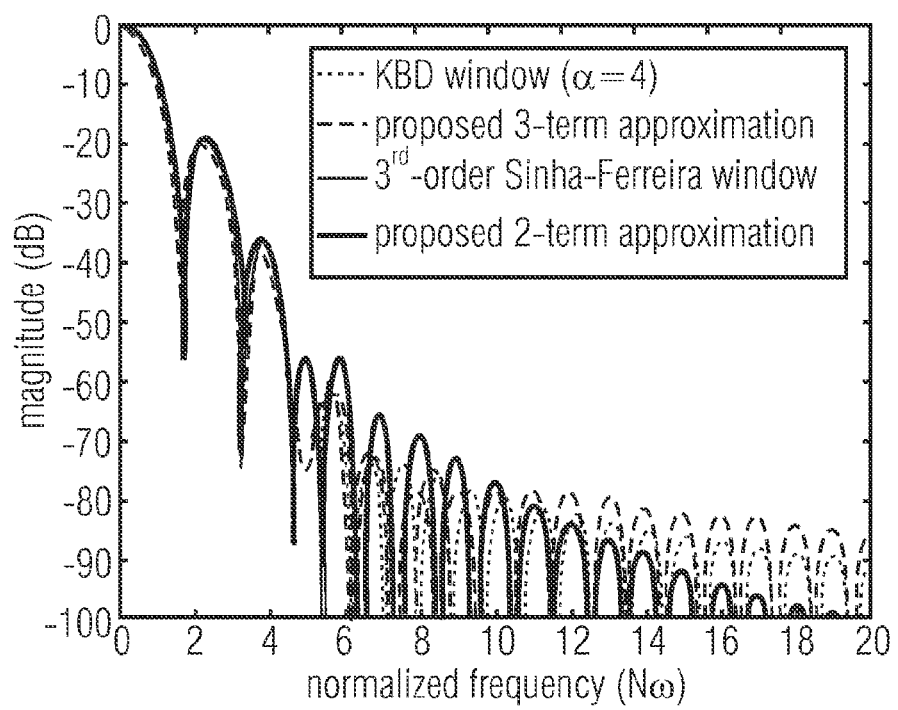
FIG. 9 shows a graphical representation of the frequency magnitude responses of another two instances of the inventive window function in comparison to those of the AAC KBD and the third order Sinha-Ferreira windows.

In certain cases, it might be desirable to utilize windows whose side lobes decay at rates of more than 12 dB per octave. The present invention allows for the construction of, for example, a window falling off at 24 dB per octave. This is achieved by necessitating a continuous first differential of the weighting function, i.e. a vanishing differential at the edges of the window instance. The most intuitive solution to this problem is the configuration $a_1=0.1591$, $a_2=0$. The resulting window response is depicted in FIG. 9 alongside three other responses which are discussed in the following.

6.3.4 Windows Approximating Reference Windows

To complete this demonstration of the flexibility of the proposed window class, an attempt is made to create two window realizations which closely resemble two existing windows. Due to their diversity, the KBD ($\alpha$=4) and the $3^{rd}$-order Sinha-Ferreira functions are chosen as references. Reconstruction via c'(n) and equation (9) is approached in a least-squares sense, i.e. by minimizing the squared difference between reference and approximation (note that other methods are also possible). FIG. 9 shows the outcome. It can be seen that the inventive windows are nearly identical to their prior-art counterparts and that major differences occur only at very low levels. In complexity or memory critical environments, the reference windows could therefore be substituted by a device using the present window class while maintaining a high degree of backward compatibility and, if applicable, the possibility of near-perfect reconstruction.

7. Implementation in a Signal-Adaptive System

An additional advantage of the presented window class arises when a system processes signal segments of differing lengths, with the lengths being related by integer powers of 2. In AAC, for instance, this procedure, which is also known as block switching, is realized by applying the MDCT either once on 2048 (1920) or 8 times on 256 (240) samples per frame. Here, subsets of the individual terms in equation (8), for example n=0, 1, . . . , N/8−1, can be re-used as core functions for the lower-length windows or, in case of the sine terms, even as window functions themselves. If a reduced design flexibility for the low-length windows is acceptable, this can be exploited to further reduce the memory capacity necessitated for storing the core functions.

8. Further Applications of the Invention

Power complementary window functions such as the ones reported herein can be quite attractive for several application scenarios other than audio or video coding. As noted in the paper cited in paragraph 6 of the Background section, power complementary windows can be employed in instantaneous-energy preserving cross fade or switching systems as well as signal analysis and processing devices operating on a block-by-block basis with overlap between successive blocks. More generally speaking, any apparatus performing filtering tasks on a one- or higher-dimensional signal may use windows of the present report in the construction of its filtering kernel(s), including, but not limited to,

- highpass (differentiation), lowpass (integration), and bandpass filters,
- downsamplers (decimation filters) and upsamplers (interpolation filters),
- single- or multi-band equalizers, compressors, expanders, and limiters,
- algorithms for noise reduction and related enhancement or effects tools.

By adopting in such systems the inventive window function presented herein and tailoring its spectral characteristics to application requirements, in a signal segment adaptive fashion, it is hoped that perceptual performance increases can be achieved.

9. Media Signal Encoder and Media Signal Decoder According to FIG. 10

Figure 10:
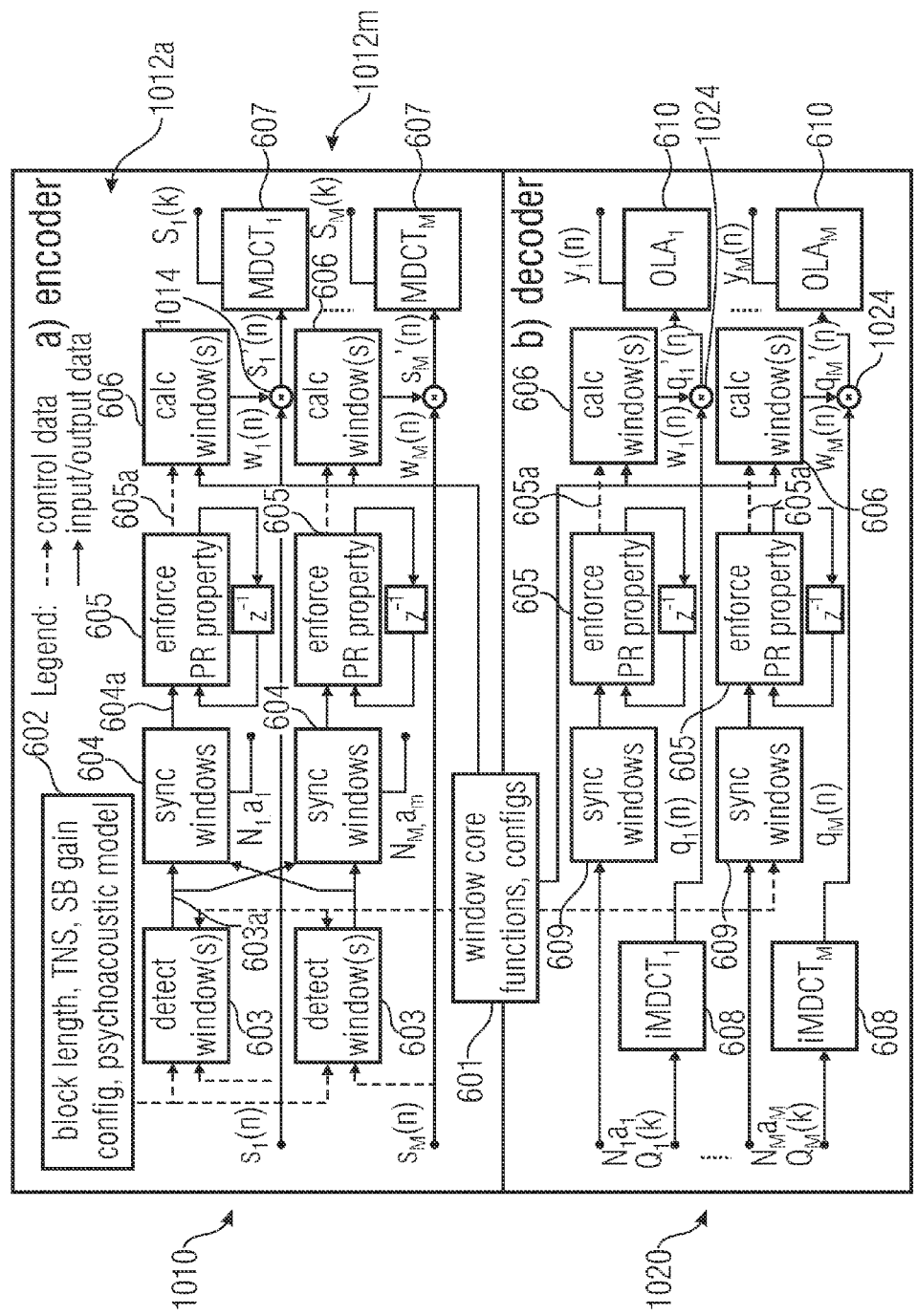
FIG. 10 shows, in a block diagram, the signal adaptation process for the inventive and similar window functions.

FIG. 10 shows a block schematic diagram of a media signal encoder and of a media signal decoder. The media signal encoder 1010 is configured to receive one or more channel signals $s_1(n)$ to $s_M(n)$ and to provide, on the basis thereof, an encoded representation. The encoded representation of the input media signals may take the form of MDCT coefficients $S_1(k)$ to $S_M(k)$, or may be an encoded representation of such MDCT coefficients. The signal encoder 1010 comprises, for example, a plurality of identical signal paths 1012a-1012m, which may operate independently or which may be coupled. In addition, the signal encoder 1010 also comprises an encoding parameter computation 602, which determines one or more of the encoding parameters like, for example, a block length, a temporal noise shaping (TNS) parameter, a sub-band gain compensation parameter, a configuration information and/or a psychoacoustic model information. In the following, a path or branch 1012a will be discussed, but the above discussion is also applicable to further branches like, for example, the branch 1012m.

The branch 1012a comprises a window detection 603, which receives the input signal $s_1(n)$ of the respective channel and information from the encoding parameter determinator 602. The window detection 603 may provide, for example, a window shape information 603a, which describes a shape of a desired window.

The window shape information may, for example, be determined from the input to the window detector 603 such that the objective performance (coding gain, frequency selectivity or energy compaction, data compression, amount of aliasing introduced) or subjective performance (perceptual quality of the encoded output after error-free or erroneous transmission and decoding) of the encoder 1010 is optimized or improved.

The branch 1012a also comprises a window synchronization 604, which should be considered as being optional, and which may combine the window shape information provided by the window detection 603 of the present branch 1012a with window shape information provided by window detectors of different branches. Accordingly, a synchronized window shape information 604a may optionally be provided by the window synchronization 604. The signal path 1012a also comprises a perfect reconstruction enforcement 605, which is configured to receive the window shape information 603a, or the synchronized window shape information 604a, and to provide, on the basis thereof, an adapted window shape information 605a. For example, the perfect reconstruction enforcement 605 may ensure that a right-side transition slope (also designated as window slope) of a window associated with a previous portion of the input signal is a mirrored version of a window slope of a window associated with a subsequent portion of the input signal. For example, it may be ensured that window slopes of windows associated with subsequent portions of an input signal are defined by identical window shape parameters. The signal path 1012a also comprises a window calculation 606 which is configured to provide signal processing window values $w_1(n)$ to a windower 1014. The windower 1014 is configured to multiply samples of the input signal $s_1(n)$ with the corresponding signal processing window values $w_1(n)$, to obtain windowed signal values $s_1'(n)$, which are input into a modified discrete cosine transformer 607, to obtain the MDCT coefficients $S_1(k)$.

It should be noted here that the window calculator 606 may take over the functionality of the window provider 130 or of the window provider 180, such that the signal processing window values $w_1(n)$ are equivalent to the signal processing window values $w(n)$ or to the signal processing window values $w(t)$. Also, the windower 1014 may take the functionality of the windower 120.

Accordingly, the encoder 1010 is configured to apply a plurality of different windows for the windowing of the input signal $s_1(n)$ in dependence on the adapted window shape parameters 605a, wherein the window calculation 606 provides signal processing window values.

The encoder 1010 may optionally comprise further encoding stages for efficiently encoding the spectral values $S_1(k)$ to $S_M(k)$ provided by the MDCT transform 607.

The signal decoder 1020 is configured to receive decoded spectral values $Q_1(k)$ to $Q_M(k)$. The decoded spectral values $Q_1(k)$ to $Q_M(k)$ may be extracted from a bitstream, which may be provided by the encoder 1010 by encoding the spectral values $S_1(k)$ to $S_M(k)$. In other words, the spectral coefficients $Q_1(k)$ to $Q_M(k)$ may be identical, except for quantization errors, to the spectral values $S_1(k)$ to $S_M(k)$. Here, k is a frequency index and $M \geq 1$ designates a number of channels (wherein one branch is provided per channel).

The decoder 1020 is also configured to receive window length values $N_1$ to $N_M$ (which take the function of the variable N as described above) and one or more window shape parameters $a_1$ to $a_M$ (for example, one per branch or channel). The decoder 1020 comprises an inverse modified-discrete-cosine-transformer 608 which is configured to receive the spectral coefficients $Q_1(k)$ to $Q_M(k)$ and to provide, on the basis thereof, inversely transformed signals $q_1(n)$ to $q_M(n)$. The decoder 1020 also comprises a window selection 609, which operates in combination with a perfect reconstruction enforcement 605 to derive adapted window shape parameters

605a from the input window shape parameters a₁ to a_M, wherein the input window shape parameters a₁ to a_M may be extracted or derived from a bitstream representing a media content. For example, both the input window shape parameters a₁ to a_M and the spectral values $Q_1(k)$ to $Q_M(k)$ may be represented in the encoded media signal.

The decoder 1020 further comprises a window calculation 606, which receives the adapted window shape parameter 605a (or, alternatively, the input window shape parameters a₁ to a_M) and provides, on the basis thereof, the signal processing window values $w_1(n)$ to $w_M(n)$. The window calculation 606 may perform the functionality of the window provider 130 or of the window provider 180, wherein the adapted window shape parameters 605a may correspond to the one or more window shape parameters 132 or to the one or more window shape parameters 182. Similarly, the signal processing window values $w_1(n)$ to $w_M(n)$ may be equivalent to the signal processing window values $w(n)$ or to the signal processing window values $w(t)$.

Accordingly, the window calculation 606 may provide windows of different shapes in accordance with the adapted window shape parameters 605a or the input window shape parameters a₁ to a_m.

The signal processing window value $w_1(n)$ to $w_M(n)$ provided by the window calculation 606 of the decoder 1020 may be applied, for example, by a multiplication operation 1024, to the inversely transformed signals $q_1(n)$ to $q_M(n)$ provided by the inverse-modified discrete-cosine transform 608 to obtain a windowed version $q_1'(n)$ to $q_m'(n)$ of the values $q_1(n)$ to $q_M(n)$.

The decoder 1020 further comprises an overlap-and-add 610, which is configured to receive subsequent window portions $q_1'(n)$ to $q_m'(n)$ of the inversely transformed signals $q_1(n)$ to $q_M(n)$ and the overlap-and-add said subsequent portions, to obtain reconstructed signals $y_1(n)$ to $y_M(n)$. The overlap-and-add 610 is coordinated with the windowing 1024 such that windowed signal portions $q_1'(n)$ to $q_m'(n)$ which are overlapped by the overlap-and-add 610 are windowed with "complementary" windows, such that a right-sided window slope of a first window overlaps with a left-sided windowed slope of a subsequent window, wherein the overlapping window slopes comprise the energy conservation and/or perfect reconstruction characteristics discussed above.

Thus, the encoder 1010 and the decoder 1020 are capable of encoding and decoding media signals like, for example, audio signals, speech signals, video signals, image signals, etc.

To conclude, the above embodiments according to the present inventions can be implemented in software and both hardware chips and in digital signal processors (DSPs) for various kinds of systems and analog or digital storage or transmission of signals.

To summarize, FIG. 10 illustrates how the proposed windowing technique can be used in a signal-adaptive AAC-like audio codec or a different type of signal encoder or signal decoder. The window core functions 601 for the construction of c'(n) are stored in memory along with a definition of available parameter configurations. These data are shared by encoder and decoder. The encoder, shown in FIG. 10a, of reference numeral 1010, segments for each frame the M input channels, and for each of the M segments s(n), data from a spectro-temporal psychoacoustic model 602 are analyzed in a window detector and selector 603 to determine a suitable window shape and if applicable, length and number. An adequate window is chosen based on criteria such as frequency selectivity (energy compaction) or low frame overlap (aliasing reduction when using TNS or sub-band (SB) gain compensation).

In other words, the encoder 1010 (or any other signal processor) may be configured to determine, vary or adjust one or more of the window shape parameters $a_f$ in a signal-adaptive fashion such that an objective performance or a subjective performance of the signal processor is optimized or improved. Accordingly, the one or more window shape parameters may be determined, varied, or adjusted in an input-signal adaptive fashion such that the objective (i.e. numerical) or subjective (i.e. perceptual) performance of the signal processor (for example, the audio encoder 1010) is optimized or improved.

After optional matching of the channels' window shape parameters via synchronization unit 604, perfect reconstruction (PR) of the transforms to be performed using the chosen window functions is ensured in a PR enforcement unit 605 by adjusting the parameters for the overlapping window halves of the current and previous frame. Based on the modified window shape parameters, using equations (8) and (9), the actual window coefficients are calculated 606 and multiplied with the respective audio segment, forming a windowed segment s'(n) which is finally transformed to frequency domain by means of a MDCT 607 for subsequent quantization, coding, and transmission. In the decoder shown in FIG. 10b), at reference numeral 1020, the received window shape parameters for each frame and channel are decoded and forwarded to a window selector 609, which maps them to the corresponding window configuration for use after the inverse MDCT 608 of the dequantized spectra Q(k). After enforcing PR of the window sequences and computing the window coefficients analogous to the encoder, the output segments q(n) resulting from the inverse MDCTs are windowed and, by means of overlap-addition 610, the individual channel waveforms y(n) are reconstructed.

10. Alternative Window Calculation 10.1. Overview Over the Computation of a Window Function of an Alternative Window Class In the following, an alternative class of window functions will be described, which can be used by a window provider (for example, by the window provider 180 or by the window provider 300 or by the window calculation 606) for providing signal processing window values.

In other words, in the following, details regarding the definition of an alternative class of windows will be given, which are based on a substantial modification of some of the above equations.

In one of the preceding sections, it was noted that equation (12) with a=2, that is, $w_2(t)$, is equivalent to equation (15) with K=1, $b_0$=0.5, $b_1$=0.5. Moreover, equivalence between $w_4(t)$ and (15) with K=2 and $b_k$ of (16) was established. It has been investigated as to which $b_k$ yield $w_1(t)$, $w_3(t)$, or more generally, any $w_a(t)$ with odd a. Observing equations (12) and (15), it has been found that it is impossible to construct a sum-of-cosines window which is equivalent to an odd-exponentiated sine window. However, in some applications where odd-a $w_a(t)$ are necessitated, it may be desirable to use a formulation similar to equation (15) to allow for spectral leakage optimizations as carried out by Hamming, Blackman, and Nuttall.

Luckily, it has been found that the sum-of-sines functions $$w_c(t) = \sum_{k=0}^{K} (-1)^k c_k \sin\left((2k+1)\pi \cdot \frac{t}{L}\right) \quad (19)$$

provide the necessitated means for optimization. As can be seen, the signal processing window values $w_c(t)$ can be obtained by forming a weighted sum of sine-type shaping functions $\sin((2k+1)\pi \cdot t/L)$. A signal window slope can be obtained for values of t between 0 and L/2.

It should also be noted that sine functions, the frequencies of which are odd multiples of a fundamental frequency, are summed. For example, the normalized angular frequencies can be defined as $(2k+1)\pi/L$. It can be seen that the higher normalized frequencies are odd multiples of a fundamental normalized frequency $\pi/L$.

It should also be noted that shaping functions are alternatingly weighted with positive and negative weights $(-1)^k c_k$ with increasing frequency index k (for k between zero and a maximum frequency index value K).

By choosing the constants $c_k$ suitably, two features can be acquired.

First, a window corresponding to an odd-exponentiated sine window of (2) can be constructed. The $c_k$ for the three lowest-order odd-a $w_a(t)$ shall be specified here. The classic sine window $w_1(t)$ is trivial to construct using (19) by setting K=0 and $c_0$=1. For $w_3(t)$, K is increased to K=1, and
$c_0$=0.75, $c_1$=0.25. \quad (20)

The fifth-order $w_5(t)$ is finally obtained using K=2 and $c_0$=0.625, $c_1$=0.3125, $c_2$=0.0625. \quad (21)

Second, like the $b_k$ in (15), the $c_k$ can be determined such that spectral behavior similar to that of the Blackman, Hamming, and Nuttall windows is achieved. Before deriving the respective $c_k$ for K=1 and K=2, though, it is important to assess exactly which aspect of a window's spectral response should be optimized. To this end, objective measures of the spectral performance of a window are necessitated. In the next section, an analysis of all window functions mentioned thus far is conducted by means of some popular measures.

10.2. Evaluation and Optimization

In the following, the performance of the 2- and 3-term variants of this window class will be evaluated and compared to other windows using some of the figures of merit described in reference [2]. Motivated by the result, specifically optimized realizations will be described.

In the following, different sets of window shape parameters $c_k$ will be discussed. It will be shown that the combination of the signal processing window values according to equation (19) allows to create a wide variety of different windows having different characteristics. Accordingly, it can be summarized that the window provider configured to provide the signal processing windows $w_c(t)$ according to equation (19) is very flexibly configurable and brings along a very low computational complexity, because the shaping function $\sin((2k+1)\pi \cdot t/L)$ can be pre-computed while the weighted summation brings along a comparatively small computational complexity.

It is well established that the multiplication of a time signal by another signal corresponds to the convolution of the frequency transforms of the two signals. Hence, by applying a weighting function to a signal, the signal's spectrum is convolved with the spectrum of the weighting. To evaluate the effect of a window function, it therefore suffices to study its spectrum, for instance using Fourier transformation.

Figure 11:
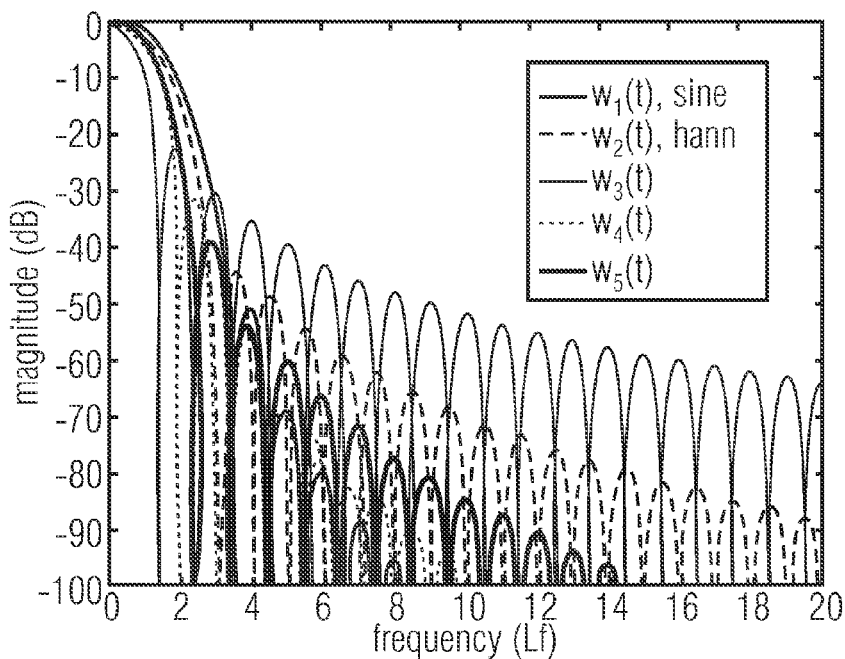
FIG. 11 shows a graphical representation of spectra of some exponentiated sine functions according to equation (12)
Figure 12:
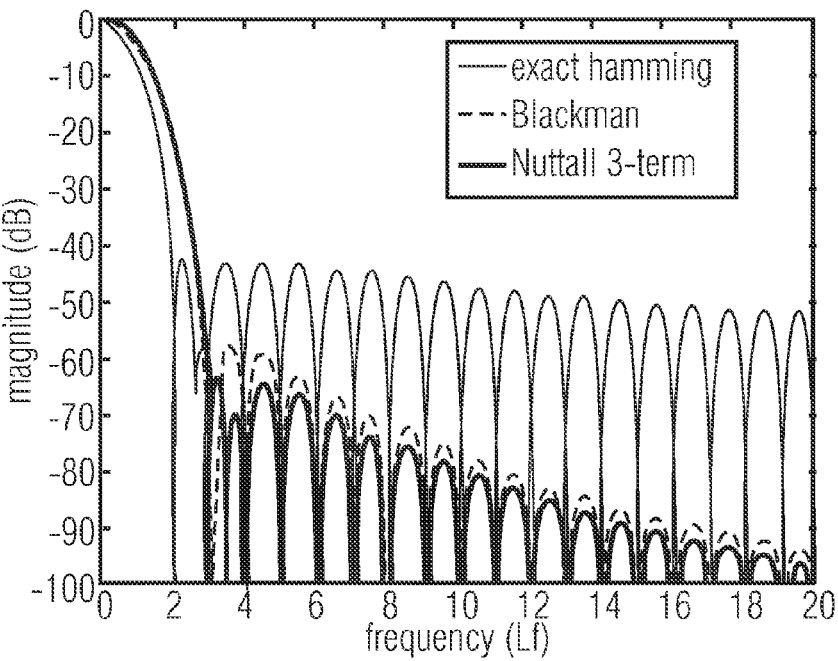
FIG. 12 shows a graphical representation of spectra of optimized sum-of-cosines functions according to equation (15)

FIGS. 11 and 12 illustrate the magnitudes of the power spectra of the above windows, normalized in frequency and amplitude as in reference [4]. Due to recurring spectral zeros, all windows exhibit a main lobe at zero frequency and side lobes decaying in amplitude with increasing frequency. The falloff rate of the side lobes is dictated by the discontinuities at the edges of the window function as well as those of its differentials; the more low-order derivatives are continuous, the faster a window decays to zero for large f. See also references [2] and [4]-

For the exponentiated sine functions $w_a(t)$ of FIG. 11, it can be stated that the asymptotic falloff in dB per octave is proportional to a (see, for example, reference [6]):

$$\text{falloff}(w_a) = -6.02(a+1)\frac{dB}{oct}. \quad (22)$$

This appears to hold for all nonnegative real a, not only integers. For the optimized windows of FIG. 12, a different side lobe behavior can be observed. The Hamming window, whose main lobe width equals that of $w_2(t) = w_{Hann}(t)$, falls off at only −6 dB per octave because the weighting function is not continuous. Similarly, the Blackman and Nuttall windows, which have the same main lobe width as $w_4(t)$, show a decay of only −18 dB per octave; their first derivatives of weighting are continuous, but their third derivatives are not. However, these windows exhibit lower maximum side lobe levels than their $w_a(t)$ counterparts. This can lead to notably reduced spectral bias in some applications and is the reason why the optimized windows were developed.

Since it has been found that the optimization procedure used for the sum-of cosines windows in FIG. 12 can also be applied to the sum of-sines functions of (19), it is possible to modify the 2-term window with (20) and the 3-term window with (21) for the lowest maximum side lobe level (the one-term sine window with $c_0$=1 cannot be optimized this way). It has been found that due to the use of sinusoids, any realization of (15) approaches zero amplitude at its endpoints; a side lobe falloff rate of −12 dB per octave ($1/f^2$, see reference [2]) is therefore guaranteed. If the derivatives are allowed to be discontinuous, additional degrees of freedom are obtained for determining the $c_k$, which can be employed to minimize the peak side lobe magnitude (see, for example, reference [4]).

For the two-term sum-of-sines window (K=1), the admission of a discontinuous first derivative yields one extra degree of freedom in the choice of c0 and c1. It is found that $c_0$=0.79445, $c_1$=0.20555 \quad (23)

produce the lowest possible side lobe maximum of −54.3 dB (first and third side lobe). The 3-term window (K=2) offers two extra degrees of freedom in the selection of the ck. The minimum peak side lobe level of −82.8 dB is reached using $c_0$=0.69295, $c_1$=0.2758, $c_2$=0.03125 \quad (24)

Figure 13:
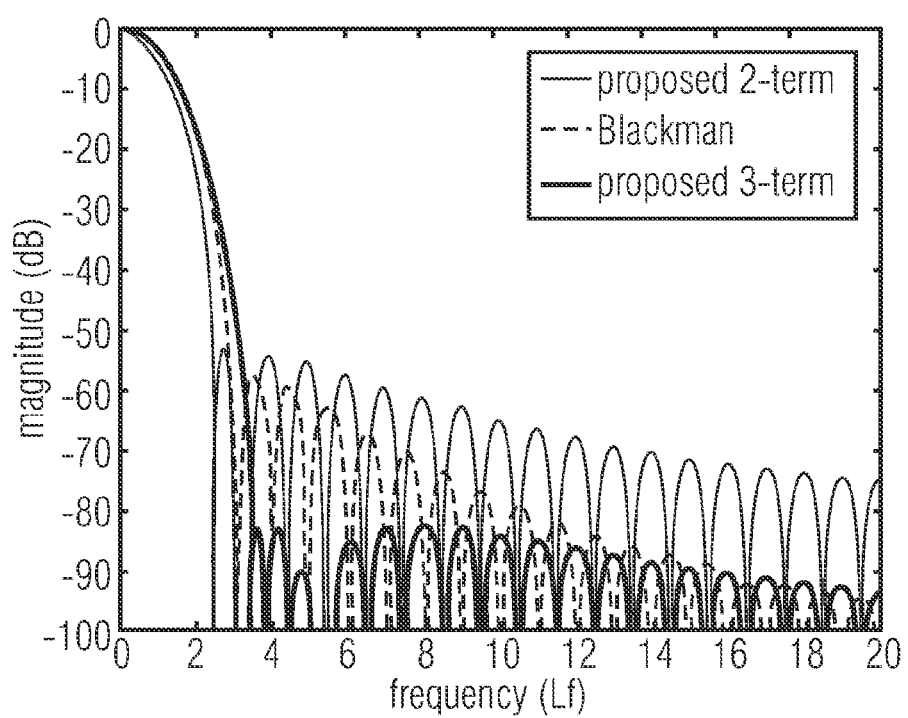
FIG. 13 shows a graphical representation of the proposed optimized sum-of-sines windows according to equation (19)

FIG. 13 shows the power spectra of windows (23) and (24). For all ten presented windows, the maximum side lobe level, the asymptotic falloff, the main lobe width (as given by the location of the first zero), and the 6-dB bandwidth (a measure of the resolution of a window, see reference [2]) are listed in Table 1. Note how in terms of overall spectral performance, window (23) lies right between the 2-term Hamming and 3-term Nuttall window. Moreover, while achieving a side lobe peak similar to that of the Blackman window, window (23) has a narrower main lobe. Window (24) has the lowest side lobe maximum of all windows in this discussion, but along with $w_5(t)$, it also exhibits the widest main lobe.

TABLE 1

FIGURES OF MERIT FOR THE PRESENTED WINDOWS

| window function | side lobe maximum (dB) | side lobe decay (dB/oct.) | main lobe width (Lf) | 6-dB bandwidth (Lf) |
|---|---|---|---|---|
| $w_1(t)$, 1-term sine | −23.0 | −12 | 3 | 1.64 |
| $w_2(t)$, hann | −31.5 | −18 | 4 | 2.00 |
| $w_3(t)$, 2-term sine | −39.3 | −24 | 5 | 2.31 |
| $w_4(t)$, 3-term cos. | −46.7 | −30 | 6 | 2.59 |
| $w_5(t)$, 3-term sine | −53.9 | −36 | 7 | 2.84 |
| exact hamming | −43.2 | −6 | 4 | 1.82 |
| proposed 2-term | −54.3 | −12 | 5 | 2.10 |
| Blackman | −58.1 | −18 | 6 | 2.30 |
| Nuttall 3-term | −64.2 | −18 | 6 | 2.36 |
| proposed 3-term | −82.8 | −12 | 7 | 2.48 |

To conclude, a computation of the signal processing window values according to equation (19), brings along the possibility to obtain windows of very different characteristics by varying only the parameters $c_k$ without varying the underlying computation rule. This reduces the computational effort and the implementation effort. Also, in some embodiments, one or more of the different parameter sets (20), (21), (23) or (24) may be used. The signal processing window value may be computed and stored in a look-up table, or may be computed online (whenever necessitated), depending on the actual implementation.

10.3. Sum-of-Sines Windows and the Discrete Fourier Transform (DFT) or MDCT

In the following, an interesting feature of the proposed window class when used in the Discrete Fourier Transform will be described.

The observant reader will have noticed the difference in the zero locations between the spectra of the sum-of-sines and the sum-of-cosines windows. As apparent in the figures, for the latter windows, most or all zeros occur at integer multiples of Lf, whereas for the sum-of-sines windows, the zeros lie halfway between integer Lf. In the following, this feature shall be illuminated with regard to analyzing the spectra of windowed harmonic signals using the DFT.

Figure 14:
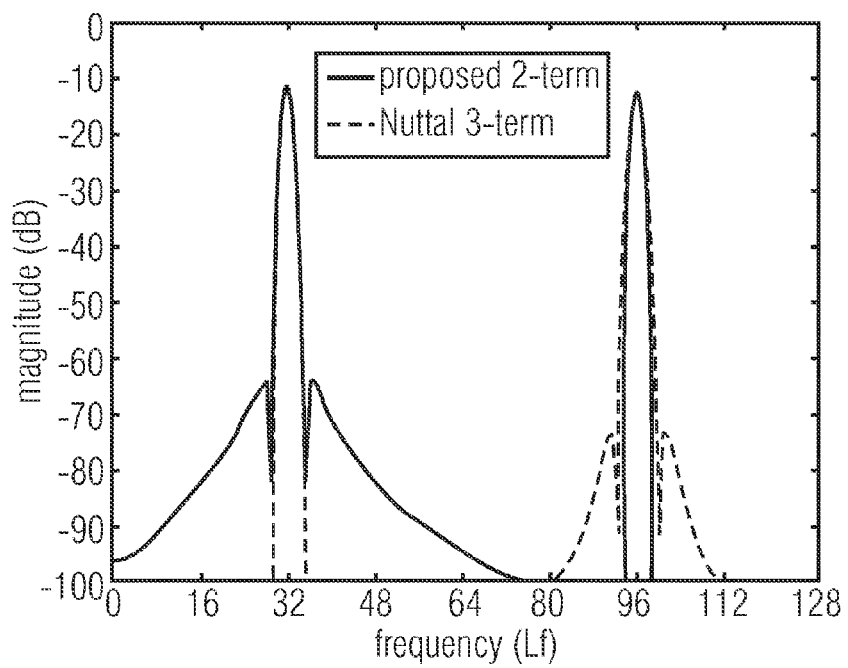
FIG. 14 shows a graphical representation of DFT spectra of two sinusoids with frequencies of Lf=32 and 96.5, after applying different window functions.

As noted earlier, the Fourier transform (FT) of a signal interval s(t) weighted by w(t) is equivalent to the convolution of the individual FTs of s(t) and w(t). The FTs of the sine window $w_1(t)$ and the Hann window $w_2(t)$ are given by $$W_1(f) = \frac{2\cos(\pi f)}{\pi(1 - 4f^2)} \quad (25)$$

and $$W_2(f) = \frac{\sin(\pi f)}{2\pi f(1 - f^2)}, \quad (26)$$

respectively (see, for example, reference [3]). Thus, $W_1(f)=0$ for $f=n+0.5$, $|n|\geq 1$, and $W_2(f)=0$ for $f=n$, $|n|\geq 2$, with n being an integer. The FTs of the higher-order and optimized windows of Table 1 differ from (25) and (26), but the respective trigonometric term in the numerator (cos( ) for the sum-of-sines, sin( ) for the sum of-cosines windows) is common to all. In the context of the DFT, the implication is that maximum spectral leakage with a sum-of-cosines window coincides with minimum leakage with a sum-of-sines window, and vice versa. An example is given in FIG. 14 for the proposed 2-term window (23) and Nuttall's 3-term window (18) applied in a 256-point DFT.

In contemporary audio or video coders, a signal waveform is divided into segments, and each segment is quantized to a coarser representation to obtain high data compression, i.e. a low bit rate necessitated for storing or transmitting the signal. In an attempt to achieve a coding gain by means of energy compaction (or in other words, to increase perceptual quality of the coded signal for a given bit rate), filter-bank transformations (for example, MDCT-transforms 607) of the segments prior to quantization have become popular. Most recently developed systems apply time-to-frequency transformation in the form of the modified discrete cosine transform (MDCT), a filter bank permitting adjacent segments to overlap while providing critical sampling.

For better performance, the forward and inverse MDCT operations (for example, MDCT transform 607 and inverse MDCT transform 608) are accompanied by weighting of each segment: on encoder side, an analysis window (for example, a window $w_1(n)$) is employed before the MDCT, and on decoder side, a synthesis window (for example, a synthesis window $w_1(n)$) is applied after the inverse MDCT.

Unfortunately, not every weighting function is suitable for use with the MDCT. Assuming identical, symmetrical analysis and synthesis window functions, $$w(L-1-t)=w(t), t=0,1,\ldots,T-1, \quad (27)$$

the entire system can only yield perfect input reconstruction in the absence of quantization or transmission errors if $$w^2(t)+w^2(T+t)=1, t=0,1,\ldots,T-1, \quad (28)$$

with T=L/2. This is the so-called Princen-Bradley or power complementarity (PC) condition reported in [7]. Common PC windows are the sine and KBD windows utilized in the MPEG-2/-4 AAC standard (see, for example, references [6] and [8]), with the former given by $$w_{sine}(t) = \sin\left(\pi \cdot \frac{t+0.5}{L}\right), \quad (29)$$

as well as the window of the Vorbis codec specification (see, for example, reference [9]), $$w_{vorbis}(t) = \sin\left(\frac{\pi}{2} \cdot \sin^2\left(\pi \cdot \frac{t+0.5}{L}\right)\right). \quad (30)$$

To investigate if equation (19) can be used to create sum of-sines windows satisfying (28), we note that, given (27), $w_{sine}(t)$ can be regarded as the sine of a triangular function:

$$\tau(L-1-t) = \tau(l) = \frac{t+0.5}{T}, \quad (31)$$

$$w_{sine}(t) = \sin\left(\frac{\pi}{2} \cdot \tau(t)\right). \quad (32)$$

Likewise, $w_{vorbis}(t)$ can be written as (32) with $\tau(t)$ replaced by $$\tau'(t) = \sin^2\left(\frac{\pi}{2} \cdot \tau(t)\right). \tag{33}$$

The amplitude complementarity about $T=L/4$ of (31) and (33) (or 31'), $$\tau(t)+\tau(T-1-t)=1, t=0,1,\ldots,L/4-1, \tag{34}$$

suggests that alternatives to these functions can be designed to optimize the frequency response of the window function without sacrificing the PC property. In fact, upholding (27), $$\tau_d(t) = \tau(t) + \sum_{k=1}^{K} d_k \sin(2k\pi \cdot \tau(t)) \tag{35}$$

is an extension of (31) conforming to (34), which employs a modification of the sum-of-sines function of (19); the alternating-sign term is omitted, and instead of odd multiples of $\pi$, even multiples are considered. Informal experiments run by the present author indicate that, although PC is obtained even with $d_k$ yielding $\tau_d(t)<0$ for some t, only realizations with nonnegative $\tau_d(t)$ for all t yield satisfactory pass-band selectivity and stop-band rejection simultaneously.

Figure 15:
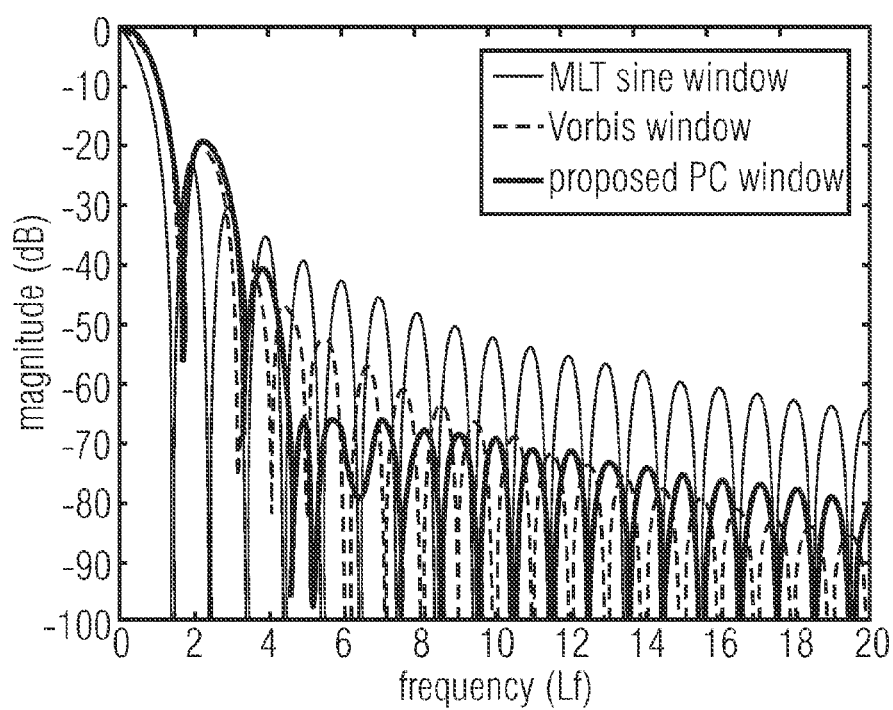
FIG. 15 shows a graphical representation of spectra of two PC windows and proposed window.

Moreover, in the section titled "Evaluation and Optimization" $c_k$ coefficients of (19) were chosen such that the maximum side lobe level of the resulting window is minimized. A similar procedure can be followed here. However, owing to the PC constraint of (28), the spectral design possibilities are more limited, especially regarding the first two or three side lobes. In general, one has to specify a lower frequency border $Lf_0>1.5$ (or alternatively, a start side lobe) above which the side lobe maximum can be minimized by a reasonable amount. To give an example, an informal exhaustive search with $Lf_0=4.5$ yields the 2-term parameterization $$d_1=0.12241, d_2=0.00523, \tag{36}$$

which produces a window whose first three side lobes above $Lf_0$ all have a level of $-66.8$ dB. The higher-frequency side lobes decay from that value at a rate of $-12$ dB per octave, just like those of the optimized windows (23) and (24) of the previous sections. The frequency response of the weighting function constructed using (27), (32), (35) and (36) is shown in FIG. 15 along with those of $w_{sine}(t)$ and $w_{vorbis}(t)$. Clearly, a substantial increase in side lobe rejection is achieved in the proposed window in comparison to the sine window. Due to constraint (28), this advantage comes at the cost of a slightly wider main lobe and higher first side lobe. A comparison to the Vorbis window shows almost identical main lobe widths and maxima of the first two side lobes. For $4.5<Lf_0<11.5$, the proposed window outperforms $w_{vorbis}(t)$ in terms of side lobe attenuation. Note also that the Vorbis window spectrum falls off at $-18$ dB per octave and has its magnitude zeros at (or near) integer multiples of $Lf$. Hence, its spectral behavior resembles that of a sum-of-cosines window. In fact, it may be considered the PC equivalent of the Hann window. Likewise, the proposed PC window seems to be a counterpart of the optimized sum-of-sines windows of the section titled "Evaluation and optimization". A more thorough investigation, including a performance evaluation in the context of audio coding, is a topic for future research.

11. Implementation Alternative

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Some or all of the method steps may be executed by (or using) a hardware apparatus, like, for example, a microprocessor, a programmable computer or an electronic circuit. In some embodiments, one or more of the most important method steps may be executed by such an apparatus.

The inventive encoded media signal, which may be an encoded audio or video signal, or sequence of window functions can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a Blu-Ray disc, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer-readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise a computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

12. Conclusions

From the above it can be concluded that a computation of the window function as explained with reference to equations (6), (8) and (9) yields a window function having particularly good characteristics.

In addition, it can be concluded that a computation of the window functions as explained with reference to equation (19) yields a window function having good characteristics.

To summarize the above, embodiments according to the present invention relate generally to signal analysis and processing methods such as those which may be used in audio or video coding systems. Some embodiments according to the invention pertain to applications necessitating signal energy compaction by means of invariant or signal-adaptive variant filter-bank transformation of the source. They may be utilized to improve energy compaction performance while enabling a perfect inversion of said transformation. Embodiments according to the present invention therefore constitute a solution to the need for an alternative window function having a moderate computational complexity, but providing a good design flexibility.

Some embodiments according to the present invention, as defined by the appended claims or this description, address the lack of flexible and computationally efficient window functions for MDCT applications by declaring an extension to the sine window function of equation (4).

However, other embodiments according to the invention create improved window functions, which provide an increased flexibility, but do not provide the possibility for a perfect reconstruction in MDCT applications. Nevertheless, such window functions are helpful in many applications.

It should also be pointed out that in order to facilitate the understanding of the present invention, the invention has been described by way of illustrative examples, not limiting the scope or spirit of the invention with reference to the accompanying drawings. In other words, the embodiments described herein are merely illustrative for the principles of the present invention for more flexible windowing and/or improved signal energy compaction in filtering applications. It is understood that variations and modifications of the arrangements and the details described herein will be apparent to others skilled in the art. It is the intent, therefore, to be limited only by the scope of the impeding patent claims and not by the particular details disclosed by way of description and explanation of the embodiments herein.

Generally speaking, windowing of discrete signals by temporal weighting is an essential tool for spectral analysis in processing to reduce bias effects. Many popular weighting functions (e.g. Hann, Hamming, Blackman) are based on a sum of scaled cosines.

Embodiments according to the invention present an alternative class of windows, constructed using sums of sines and exhibiting modified (or even unique) spectral behavior with regard to zero location and a side lobe decay of at least −12 dB/octave due to guaranteed continuity of the weighting. The parameters for the 2- and 3-term realizations with minimum peak side lobe level are provided. Some embodiments according to the invention are related to the usage of the sum-of-sines windows with the Discrete Fourier Transform and their adoption to lapped transforms such as the Modified Discrete Cosine Transform (MDCT).

In other words, embodiments according to the invention propose alternatives to the conventional window functions (for example, Hann, Hamming and Blackman), equally easy to compute and with similar or even unique performances in terms of leakage reduction.

Very generally speaking, embodiments according to the invention create an apparatus, a method or a computer program for encoding or decoding or processing an audio or video signal using variable window functions.

Some embodiments according to the invention create an apparatus, a method or a computer program for calculating a sequence of different window functions for an audio signal or a video signal.

Further embodiments according to the invention create an encoded audio or video signal comprising encoded audio or video content and parametric window information relating to variable windows used for encoding an audio or video signal to obtain the encoded audio or video signal.

Further embodiments according to the invention create a sequence of variable window functions being determined in a signal adaptive way.

Further embodiments according to the invention create the apparatus, methods, computer programs, encoded signals and sequences of variable window functions in which a window ($w_{new}$) is derived based on $$c(n)=(n+\tfrac{1}{2})\cdot 2/N,$$

$$w_{sin}(n)=\sin(\pi/2\cdot c(n)), n=0,1,\ldots,N/2-1,$$

where $c(n)$ denotes the window core function, which can be computed in advance since it is predetermined. The proposed extension is to add to $c(n)$ in equation (7) weighted sinusoids having angular frequencies which are integer multiples of $2\pi$:

$$c'(n)=c(n)+\sin(2\pi\cdot f\cdot c(n)), f=1,2,\ldots,$$

$$w_{new}(n)=\sin(\pi/2\cdot c'(n)), n=0,1,\ldots,N/2-1.$$

To also conclude, mathematically simple alternatives to the Hamming, Blackman, and similar windows, generated using sums of weighted sines, have been presented. The sum-of-sines approach yields unique properties such as guaranteed continuity of the window function and can also be applied in the construction of power complementary windows for e.g. audio coding.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] R. B. Blackman and J. W. Tukey, The Measurement of Power Spectra from the Point of View of Communications Engineering, New York, N.Y., USA: Dover Publications, 1958.
[2] F. J. Harris, "On the Use of Windows for Harmonic Analysis with the Discrete Fourier Transform," Proc. IEEE, vol. 66, no. 1, pp. 51-83, January 1978.
[3] N. C. Geçkinli and D. Yavuz, "Some Novel Windows and a Concise Tutorial Comparison of Window Families," IEEE Trans. Acoustics, Speech, and Signal Processing, vol. ASSP-26, no. 6, pp. 501-507, December 1978.
[4] A. H. Nuttall, "Some Windows with Very Good Sidelobe Behavior," IEEE Trans. Acoustics, Speech, and Signal Processing, vol. ASSP-29, no. 1, pp. 84-91, February 1981.
[5] S. W. A. Bergen and A. Antoniou, "Design of Ultraspherical Window Functions with Prescribed Spectral Characteristics," EURASIP Journal on Applied Signal Processing, vol. 2004, no. 13, pp. 2053-2065, 2004. Available on-line at http://www.hindawi.com/GetArticle.aspx?doi=10.1155/S1110865704403114.
[6] J. O. Smith III, Spectral Audio Signal Processing, March 2009 Draft, Center for Computer Research in Music and Acoustics (CCRMA), Stanford University, CA, USA. Available on-line at http://ccrma.stanford.edu/~jos/sasp/ (accessed March 2010).
[7] J. P. Princen, A. W. Johnson, and A. B. Bradley, "Subband/Transform Coding Using Filter Bank Designs Based on Time Domain Aliasing Cancellation," Proc. IEEE 1987 ICASSP-12, pp. 2161-2164, May 1987.
[8] ISO/IEC 14496-3:2009, "Information technology—Coding of audio-visual objects—Part 3: Audio," Geneva, August 2009.
[9] Xiph.org Foundation, "Vorbis I specification," February 2010. Online at http://www.xiph.org/vorbis/doc/Vorbis_I_spec.html.

The invention claimed is:

1. A signal processor for providing a processed version of an input signal in dependence on the input signal, the signal processor comprising:
a windower configured to window a portion of the input signal, or of a pre-processed version thereof, in dependence on a signal processing window described by signal processing window values for a plurality of window value index values, in order to acquire the processed version of the input signal; and
a window provider for providing the signal processing window values for a plurality of window value index values in dependence on one or more window shape parameters,
wherein the window provider is configured to compute a weighted sum of function values of a plurality of sine-type shaping functions, which map window value index values onto corresponding function values, to acquire the signal processing window values,
wherein a weighting of the function values is determined by the window shape parameters;
wherein the window provider is configured to provide the signal processing window values $w_c(t)$ for a plurality of window value index values t according to $$w_c(t) = \sum_{k=0}^{K} c_k' \sin\!\left((2k+1)\pi \frac{t}{L}\right),$$

wherein $K \geq 1$; and
wherein $c_k'$ are window shape parameter values determined by the window shape parameters.

2. A signal processor for providing a processed version of an input signal in dependence on the input signal, the signal processor comprising:
a windower configured to window a portion of the input signal, or a pre-processed version thereof, in dependence on a signal processing window described by signal processing window values for a plurality of window value index values, in order to acquire the processed version of the input signal,
wherein the signal processing window values are result values of a weighted summation of function values of a plurality of sine-type shaping functions which map the window value index values onto corresponding function values;
wherein the signal processing window values $w_c(t)$ are defined according to $$w_c(t) = \sum_{k=0}^{K} c_k' \sin\!\left((2k+1)\pi \frac{t}{L}\right),$$

wherein t takes values between 0 and L/2 for a window slope, and wherein $K \geq 1$.

3. A method for providing a processed version of an input signal in dependence on the input signal, the method comprising:
windowing a portion of the input signal, or of a pre-processed version thereof, in dependence on a signal processing window described by signal processing window values for a plurality of window value index values, in order to acquire the processed version of the input signal; and
providing the signal processing window values for a plurality of window value index values in dependence on one or more window shape parameters,
wherein a weighted sum of function values of a plurality of sine-type shaping functions is computed to acquire the signal processing window values,
wherein the sine-type shaping functions map window value index values onto corresponding function values, and
wherein a weighting of the function values is determined by the window shape parameters;
wherein the signal processing window values $w_c(t)$ for a plurality of window value index values t are provided according to $$w_c(t) = \sum_{k=0}^{K} c_k' \sin\!\left((2k+1)\pi \frac{t}{L}\right),$$

wherein $K \geq 1$; and
wherein $c_k'$ are window shape parameter values determined by the window shape parameters.

4. A method for providing a processed version of an input signal in dependence on the input signal, the method comprising:

windowing a portion of the input signal, or of a pre-processed version thereof, in dependence on a signal processing window described by signal processing window values for a plurality of window value index values, in order to acquire the processed version of the input signal, wherein the signal processing window values are result values of a weighted summation of function values of a plurality of sine-type shaping functions, which map window value index values onto corresponding function values;

wherein the signal processing window values $w_c(t)$ are defined according to $$w_c(t) = \sum_{k=0}^{K} c'_k \sin\left((2k+1)\pi\frac{t}{L}\right)$$

wherein t takes values between 0 and L/2 for a window slope, and wherein K≥1.

5. A non-transitory computer readable medium including a computer program for performing the method according to claim 3 when the computer program runs on a computer.

6. A non-transitory computer readable medium including a computer program for performing the method according to claim 4 when the computer program runs on a computer.

\* \* \* \* \*